United States Patent [19]

Kondoh

[11] Patent Number: 5,661,417
[45] Date of Patent: Aug. 26, 1997

[54] BUS SYSTEM AND BUS SENSE AMPLIFIER WITH PRECHARGE MEANS

[75] Inventor: Harufusa Kondoh, Hyogo, Japan

[73] Assignee: Mitsubishi Denki Kabushiki Kaisha, Tokyo, Japan

[21] Appl. No.: 521,724

[22] Filed: Aug. 31, 1995

[30] Foreign Application Priority Data

Dec. 20, 1994 [JP] Japan ................... 6-316641

[51] Int. Cl.⁶ ................................ H03K 19/0185
[52] U.S. Cl. ................................ 326/87; 326/86
[58] Field of Search ............... 326/83, 86–88, 326/106, 108; 365/203

[56] References Cited

U.S. PATENT DOCUMENTS

| | | | |
|---|---|---|---|
| 4,857,764 | 8/1989 | Young | 326/83 |
| 4,883,989 | 11/1989 | Mizukami | 326/86 |
| 4,918,329 | 4/1990 | Milby | 326/86 |
| 5,030,857 | 7/1991 | Sanwo | 326/86 |
| 5,105,104 | 4/1992 | Eisele | 326/86 |

OTHER PUBLICATIONS

Proceedings of The IEEE 1994, Custom Integrated Circuits Conference, pp. 637–640, May 1–4, 1994, Harufusa Kondoh, et al., "An Efficient Self–Timed Queue Architecture For ATM Switch LSI's".

Primary Examiner—Edward P. Westin
Assistant Examiner—Benjamin D. Driscoll
Attorney, Agent, or Firm—Oblon, Spivak, McClelland, Maier & Neustadt, P.C.

[57] ABSTRACT

A purpose of this invention is to realize a bus system of high speed and low power consumption type applying precharge. A precharge signal input line (4), a power source potential ($V_{DD}$), and a bus (1) are connected to a gate electrode, a drain region, and a source region of a first MOS transistor (MNP), the power source potential ($V_{DD}$), a node (N1), and the bus (1) are connected to a gate electrode, a drain region, and a source region of a second MOS transistor (MN1), and the precharge signal input line (4) through an inverter (3), the power source potential ($V_{DD}$), and the node (N1) are connected to a gate electrode, a source region, and a drain region of a third MOS transistor (MP1), respectively. In precharge period (PC=H), the potential of the bus (BUS) rises gradually, and the both transistors (MNP, MN1) are turned off. In EVL period (PC=L), when data is output from a register (6), the potential of the bus (BUS) drops, and the second MOS transistor (MN1) is turned on.

23 Claims, 21 Drawing Sheets

BUS SYSTEM AND BUS SENSE AMPLIFIER WITH PRECHARGE MEANS

BACKGROUND OF THE INVENTION

1. Field of the Invention

The present invention relates to a bus system and a bus sense amplifier.

2. Description of the Background Art

FIG. 21 shows a conventional bus sense amplifier. This is disclosed in Proceeding pp. 637–640 at the Custom Integrated Circuits Conference in May 1994. This bus sense amplifier is of current detection type, in which an NMOS transistor of which gate electrode is connected to the output of data register is turned on, and the current flowing in a PMOS transistor with the diode connection flows into the ground through the NMOS transistor, and this current is detected at high speed by a PMOS current mirror to be converted into voltage. More precisely, supposing the gate width of the NMOS transistor at the data register side to be W, the both currents of the transistors having driving force of which gate width correspond to W and W/2 respectively are compared by the PMOS current mirror.

Hence, when the content of the data register is 0, the current flows through the NMOS transistor with width W, and the both currents flowing in the transistor with gate width W and transistor with gate width W/2 are compared at this time, and the output becomes L level. By contrast, when the content of the data register is 1, current does not flow at the input side, and hence no current and the current flowing in the transistor with gate width W/2 are compared, and the output becomes H level.

In this bus sense amplifier, since the amplitude of the bus BUS is pulled up by the NMOS transistor, its amplitude is (Vdd–Vth) during the precharge period, and does not hike up to Vdd corresponding to the high level of the ordinary CMOS circuit. Hence a bus system of high speed and low power consumption is realized. Herein, Vdd is the supply voltage, and Vth is the threshold of NMOS transistor.

However, in the circuit of conventional bus sense amplifier shown in FIG. 21, penetration current flows into the right side path in FIG. 21, and penetration current also flows into the input side. Hence, the problem is that the effect of lowering the power consumption by lowering the bus amplitude is canceled by the occurrence of those penetration current.

More specifically, in the PMOS current mirror type bus sense amplifier, when the current is pulled in from the register side, a DC current flows in the EVL period, and hence a current of 0.5 mA is consumed per amplifier.

SUMMARY OF THE INVENTION

To solve the problems, a first aspect of the invention relates to a bus system comprising a bus, a precharge signal input line for inputting a precharge signal at first level and second level in first period and second period, respectively, said precharge signal repeating the first period and the second period alternately, a control signal input line for inputting a control signal changing in level in the second period, a data holding section connected to the bus and the control signal input line, for sending out a held data signal in response to the level change of the control signal to change the potential of the bus to the second level, an output line, first, second, and third power source lines at the first level, a first MOS transistor having its gate electrode, one semiconductor region, and other semiconductor region connected to the precharge signal input line, the first power source line, and the bus, respectively, a second MOS transistor having its gate electrode, one semiconductor region, and other semiconductor region connected to the second power source line, output line, and bus, respectively, and a third MOS transistor having its gate electrode, one semiconductor region, and other semiconductor region connected to the precharge signal input line, the third power source line, and the output line, respectively, wherein each of the first, second, and third MOS transistors has such characteristic that it is able to be ON logically when the corresponding gate electrode is at the first level.

A second aspect of the invention relates to a bus system of the first aspect, wherein the data holding section comprises a register for holding the data signal, a fourth MOS transistor having its gate electrode and one semiconductor region connected to an output of the register and the bus, respectively, and a fifth MOS transistor having its gate electrode, one semiconductor region, and other semiconductor region connected to the control signal input line, other semiconductor region of the fourth MOS transistor, and a ground line.

A third aspect of the invention relates to a bus system of the first aspect, further comprising an inverter connected to the precharge input signal line and the gate electrode of the third MOS transistor, wherein the first and second MOS transistors are MOS transistors of first channel type, and the third MOS transistor is a MOS transistor of second channel type.

A fourth aspect of the invention relates to a bus system of the first aspect, wherein the relation of (threshold of the first MOS transistor)≦(threshold of the second MOS transistor) is established.

A fifth aspect of the invention relates to a bus system of the first aspect, wherein the first MOS transistor and the second MOS transistor are disposed adjacently to each other in layout.

A sixth aspect of the invention relates to a bus system of the first aspect, further comprising a bootstrap circuit having its one end and other end connected to the precharge signal input line and the bus, respectively, for enhancing the potential of the bus only in the second period.

A seventh aspect of the invention relates to a bus system of the sixth aspect, wherein the bootstrap circuit has a capacity, the capacity having its one end connected to the precharge signal line through an inverter, and its other end connected to the bus.

An eighth aspect of the invention relates to a bus system of the first aspect, wherein the second power source line comprises an inverter having its one end connected to the precharge signal input line, a first load element having its one end connected to other end of the inverter, and a voltage line connected between the other end of the first load element and the gate electrode of the second MOS transistor, further comprising a second load element connected between the other end of the first load element and the ground.

A ninth aspect of the invention relates to a bus system of the first aspect, wherein the second power source line is a line for inputting a sense enable signal being at the first level only for a specific period.

A tenth aspect of the invention relates to a bus system of the first aspect, wherein the data holding section comprises a register for holding the data signal, a p channel MOS transistor having its gate electrode and source region connected to the control signal input line and the bus, respectively, and a fourth MOS transistor having its gate electrode, one semiconductor region, and other semiconductor region connected to the output of the register, the drain region of the p channel MOS transistor, and the ground, respectively.

An eleventh aspect of the invention relates to a bus system comprising a bus, a precharge signal input line for inputting precharge signals at first level and second level in first period and second period, respectively, the precharge signal repeating the first period and the second period alternately, a control signal input line for inputting a control signal changing in level in the second period, a data holding section connected to the bus and the control signal input line, for sending out a held data signal in response to the level change of the control signal to change thereby the potential of the bus toward the first level, an output line, a first MOS transistor having its gate electrode, one semiconductor region, and other semiconductor region connected to the precharge signal input line, the bus, and a ground line, respectively, a second MOS transistor having its gate electrode, one semiconductor region, and other semiconductor region connected to the bus, the output line, and the ground line, respectively, and a third MOS transistor having its gate electrode, one semiconductor region, and other semiconductor region connected to the precharge signal input line, a power source potential, and the output line, respectively, wherein the first and second MOS transistors have channels of the same polarity, and each of the first and third MOS transistors has such characteristic that it is able to be ON upon input of the precharge signal at the first level.

A twelfth aspect of the invention relates to a bus system of the eleventh aspect, wherein the data holding section comprises a register for holding the data signal, a fifth MOS transistor having its gate electrode and one semiconductor region connected to the output line of the register and the power source potential, respectively, and a fourth MOS transistor having its gate electrode, one semiconductor region and other semiconductor region connected to the control signal input line, other semiconductor region of the fifth MOS transistor, and the bus, respectively.

A thirteenth aspect of the invention relates to a bus system of the eleventh aspect, wherein the third MOS transistor has its gate electrode connected to the precharge signal input line through an inverter, and has a channel of different polarity from the first and second MOS transistors.

A fourteenth aspect of the invention relates to a bus system of the thirteenth aspect, further comprising a sixth MOS transistor having its gate electrode, one semiconductor region, and other semiconductor region connected to the output line of the inverter, the other semiconductor region of the second MOS transistor, and the ground line, respectively, and has a channel of the same polarity as the first and second MOS transistors.

A fifteenth aspect of the invention relates to a bus system of the eleventh aspect, further comprising sense enable means connected between the other semiconductor region of the second MOS transistor and the ground line, for receiving plural sense enable signals, wherein the sense enable means conducts between the other semiconductor region of the second MOS transistor and the ground line, as function of the combination of logic levels of the plural sense enable signals.

A sixteenth aspect of the invention relates to a bus system of the fifteenth aspect, wherein the sense enable means is characterized by having a MOS tree having plural MOS transistors connected in series or parallel for receiving the corresponding sense enable signals at their gate electrodes.

A seventeenth aspect of the invention relates to a bus system of the eleventh aspect, further comprising latch means connected to the output line, for sampling the potential of the output line in the second period when the precharge signal is transferred from the second period to the first period, and for holding the obtained potential of the output line for the first period.

An eighteenth aspect of the invention presents a bus system of the seventeenth aspect, wherein the latch means comprises a seventh MOS transistor having its gate electrode and one semiconductor region connected to the output line and the power source potential, respectively, an eighth MOS transistor having its gate electrode and one semiconductor region connected to the output line of the inverter and other semiconductor region of the seventh MOS transistor, respectively, and a ninth MOS transistor having its gate electrode, one semiconductor region, and other semiconductor region connected to the output line, other semiconductor region of the eighth MOS transistor, and the ground line, respectively, wherein the seventh MOS transistor has a channel of different polarity from the first and second MOS transistors, and the eighth and ninth MOS transistors have channels of the same polarity as the first and second MOS transistors.

A nineteenth aspect of the invention relates to a bus sense amplifier for receiving a precharge signal input line for inputting a precharge signal at first level and second level in first period and second period respectively, the precharge signal repeating the first period and second period alternately, and for receiving a bus of which potential is at the second level by the output within the second period of a register for holding a data signal, comprising a first MOS transistor of first polarity having its gate electrode and one semiconductor region connected to the precharge signal input line and the bus, respectively, of which conduction is controlled by the precharge signal at the first level, a second MOS transistor having the first polarity having its one semiconductor region connected to the bus, with a potential of an ON enable level being applied to its gate electrode, an inverter connected to the precharge signal input line, and a third MOS transistor of second polarity different from the first polarity, having its gate electrode, one semiconductor region, and other semiconductor region connected to the output line of the inverter, power source potential, and other semiconductor region of the second MOS transistor, respectively.

A twentieth aspect of the invention relates to a bus sense amplifier of the nineteenth aspect,
wherein the potential of the gate electrode of the second MOS transistor is lowered from the potential of the gate electrode of the first MOS transistor.

A twenty-first aspect of the invention relates to a bus sense amplifier of the nineteenth aspect, wherein a bias obtained by resistance division of the voltage of the first level is applied to the gate electrode of the second MOS transistor.

A twenty-second aspect of the invention relates to a bus sense amplifier of the nineteenth aspect, wherein a bias obtained by resistance division through a new inverter connected to the precharge signal input line is applied to the gate electrode of the second MOS transistor.

In the first aspect of the invention, the following operations are done in the first period and second period.

(First period) In this period, the precharge signal is at the first level, and the bus system is in precharge state. That is, the first and third MOS transistors are set in ON state as the precharge signal of the first level is fed into their gate electrodes. However, by the back gate effect of the first MOS transistor, the potential of the bus to which the other semiconductor region of the first MOS transistor is connected is raised to a level of subtracting the threshold of the first MOS transistor from the level of the first power source line. This elevation of bus potential causes to change the second MOS transistor to OFF state, and as a result the output line comes in floating state, and its output level becomes the first level.

(Second period) In this period, a data signal is sent out from the bus system. That is, after getting into the second period, when the control signal changes in level, the data holding section issues a data signal. Consequently, the data holding section changes the bus potential to the first level. As a result, the second MOS transistor is turned on again. On the other hand, the first and third MOS transistors am both turned off. Therefore, the output line conducts with the bus at the second level through the second MOS transistor, and the level of the output line becomes the second level.

In the second aspect of the invention, when the control signal changes level in the second period, the fifth MOS transistor is turned on in response to this change. Moreover, the fourth MOS transistor is turned on in response to the data signal output by the register. Therefore, by the level change of the control signal, the bus and ground line conduct, and the bus potential becomes the ground level, that is, the second level.

In the third aspect of the invention, in the first period when the precharge signal is at the first level, a voltage of second level is applied to the gate electrode of the third MOS transistor, and therefore the third MOS transistor is turned on together with the first MOS transistor of which control gate is applied a voltage of first level. On the other hand, in the second period when the precharge signal is at the second level, a voltage of first level is applied to the gate electrode of the third MOS transistor, and hence the third MOS transistor is turned off together with the first MOS transistor.

In the fourth aspect of the invention, the voltage applied between the gate electrode (at the first level) of the second MOS transistor and the other semiconductor region connected to the bus in the first period is a value corresponding to the threshold of the first MOS transistor, and the relation of (threshold of first MOS transistor)≦(threshold of second MOS transistor) is established, and hence the second MOS transistor is changed to OFF state during the first period, and this OFF state is maintained.

In the fifth aspect of the invention, since the first and second MOS transistors are disposed adjacently to each other, the bus potential is raised to a level sufficient for cutting off the second MOS transistor during the precharge period.

In the sixth aspect of the invention, the bootstrap circuit further enhances the bus potential in the second period, and therefore the second MOS transistor in OFF state is prevented more securely from becoming ON state regardless of the output of the data signal.

In the seventh aspect of the invention, the capacity is not charged during the first period, and the bootstrap circuit has no effect on the bus potential. By contrast, during the second period, the capacity is charged, and hence the bus potential is raised by the portion of the voltage generated in this capacity.

In the eighth aspect of the invention, in the first period, since the voltage of the second level is applied to one end of a first load element by the inverter, current does not flow into the first and second load elements. Hence, the bias obtained by dividing the precharge signal by the first and second load elements is cut off. On the other hand, in the second period, the voltage of the first level is applied to one end of the first load element by the inverter, and the bias obtained by dividing by the first and second load elements is applied to the gate electrode of the second MOS transistor through the voltage line.

In the ninth aspect of the invention, only when the sense enable signal is at first level, the gate potential of the second MOS transistor becomes first level, and the bus system is able to operate.

In the tenth aspect of the invention, during the second period, the fourth MOS transistor is turned on by the data signal output by the register, and further the p channel MOS transistor is turned on in response to the level change of the control signal. However, by the back gate effect of the p channel MOS transistor, when the bus potential reaches the threshold of the corresponding p channel MOS transistor, the p channel MOS transistor is turned off, and the bus potential is no longer lowered. Consequently, the bus amplitude is further lowered. That is, the bus amplitude is given in the formula of [first level–(threshold of first MOS/ transistor)–(threshold of p channel MOS transistor)].

In the eleventh aspect of the invention, the bus system operates as follows in the first period and second period.

(First period) Since the precharge signal is at the first level, the first and third MOS transistors are in ON state. At this time, since one semiconductor region of the first MOS transistor is connected to the ground line, the potential of the bus connected to the other semiconductor region is also at the ground level. Therefore, the second MOS transistor is turned off together with the first MOS transistor, and the level of the output line is H level.

(Second period) The precharge signal is at the second level, and the first and third MOS transistors are turned off. On the other hand, the second MOS transistor remains in OFF state unless the data holding section operates, and the level of the output line remains at H level. However, when the data holding section issues a data signal to be held depending on the level change of the control signal, and the bus potential is raised toward the first level, the second MOS transistor is changed from OFF to ON state the moment the bus potential is raised to the threshold of the second MOS transistor. As a result, the output line conducts with the ground line, and its level becomes the ground level.

In the twelfth aspect of the invention, during the second period, receiving the output of the register, the fifth MOS transistor is turned on, and the fourth MOS transistor is also turned on by receiving the level change of the control signal. As a result, the bus potential at the ground level during the first period is raised toward the level given in the formula of (power source potential–threshold of fourth MOS transistor).

In the thirteenth aspect of the invention, in the first period, a signal of second level is fed into the gate electrode of the third MOS transistor, and the third MOS transistor has a channel of different polarity from the first and second MOS transistors, and hence the third MOS transistor is turned on. On the other hand, in the second period, since a signal of first level is fed to its gate electrode, the third MOS transistor is mined off.

In the fourteenth aspect of the invention, the sixth MOS transistor is in OFF state during the first period. Accordingly, it takes time to pull down the bus potential to the ground level, and if the first and second MOS transistors are simultaneously in ON state, current does not flow into the ground through the second MOS transistor. On the other hand, in the second period, the sixth MOS transistor is turned on, and the output line and ground line are in conductive state.

In the fifteenth aspect of the invention, the sense enable means conducts the output line and ground line during the second period, as a function of the combination of logic levels of plural sense enable signals.

In the sixteenth aspect of the invention, the sense enable function is realized by on/off operation of each of the plural MOS transistors for composing a MOS tree.

In the seventeenth aspect of the invention, the latch means holds by sampling the potential of the output line when transferring from the second period to the first period.

In the eighteenth aspect of the invention, when the bus potential is at the ground level after passing the first period, in the succeeding second period, the output potential of the latch means is at the second level. In the subsequent first period, too, the eighth MOS transistor is turned off, and the output still remains at the second level. Furthermore, in the next second period, when the bus potential is changed to the first level by the data signal output by the register, the level of the output line becomes the second level, and the seventh and eighth MOS transistors are turned on, while the ninth MOS transistor is turned off, so that the output level of the latch means is changed to the first level. In this way, the output level in the second period before the first period is maintained during the first period.

In the nineteenth aspect of the invention, the precharge signal is at the first level during the first period, and when such precharge signal is entered, the first MOS transistor is turned on, but the bus potential is raised by its back gate effect, and thereafter the first MOS transistor is turned off. Consequently, the second MOS transistor is turned off although a potential of ON level is applied to its gate electrode. Meanwhile, a signal of second level is applied to the gate electrode of the third MOS transistor by the inverter, the third MOS transistor of second polarity is in ON state. Therefore, during the first period, the level of the other semiconductor region of the third MOS transistor and the other semiconductor region of the second MOS transistor is at the first level.

In the second period, on the other hand, the precharge signal is at the second level, and when a data signal is output to the bus from the register at this time, the bus potential drops to the second level, and the second MOS transistor is changed from OFF to ON state. At this time, the first and third MOS transistors are turned off. Therefore, the level of the other semiconductor regions of the second and third MOS transistors is the second level.

In the twentieth aspect of the invention, since the gate potential of the second MOS transistor is set always lower than the gate potential of the first MOS transistor during the first period, the safe margin for preventing the second MOS transistor in OFF state from changing to ON state regardless of the data signal is increased by this portion of lowering.

In the twenty-first aspect of the invention, a voltage lower than the voltage of the first level by the portion of resistance division is applied to the gate electrode of the second MOS transistor, and therefore the operation margin is increased by this portion of lowering.

In the twenty-second aspect of the invention, during the first period, current does not flow during resistance division due to the presence of the inverter, so that the application of bias is cut off dynamically.

According to the first aspect of the invention, since the bus amplitude is small and there is no DC path, a bus system of low power consumption can be realized, and the output line is in floating state after precharge, so that a high speed bus system can be realized. In addition, since the bus potential is changed smoothly by precharge, it is effective to realize a bus system having a low power source noise characteristic. Besides, the number of parts can be decreased, and the layout area can be reduced.

According to the second aspect of the invention, since the ground side fifth MOS transistor is controlled by the control signal, even in the second period when the bus is in high impedance state, a bus system free from influence of noise of charge coupling or the like is realized.

According to the third aspect of the invention, if a further MOS inverter circuit or the like is provided outside the output line, a bus system capable of operating accurately at high speed and low power consumption is realized.

According to the fourth aspect of the invention, the precharge level of the bus can be set to a level sufficient for cutting off the second MOS transistor, so that the operation margin of the bus system can be guaranteed.

According to the fifth aspect of the invention, it is effective to guarantee the operation margin of the bus system.

According to the sixth aspect of the invention, realization of cut-off of the second MOS transistor can be assured because the bus amplitude during the second period can be increased.

According to the seventh aspect of the invention, realization of cut-off of the second MOS transistor can be assured because the bus amplitude during the second period can be increased.

According to the eighth aspect of the invention, the operation margin of the system can be increased by assuring cut-off of the second MOS transistor while preventing increase of power consumption.

According to the ninth aspect of the invention, it is effective to apply in a specific case of non-operating some of plural bus systems, while making use of the features of high speed and low power consumption.

According to the tenth aspect of the invention, the bus amplitude can be further lowered, and it is effective to further reduce the power consumption while maintaining the high speed performance.

According to the eleventh aspect of the invention, low power consumption and high speed are realized, while it is effective to increase the noise margin outstandingly. Besides, the number of parts can be decreased, and it is effective to decrease the layout area.

According to the twelfth aspect of the invention, a bus system with a wide noise margin can be realized.

According to the thirteenth aspect of the invention, it is effective to operate the bus system accurately if other circuit such as MOS inverter is further provided outside the output line.

According to the fourteenth aspect of the invention, flow of penetration current during the first period can be prevented and hence it is effective to realize a further lower power consumption.

According to the fifteenth aspect of the invention, it is effective to realize a sense enable bus system by combination of various logics.

According to the sixteenth aspect of the invention, it is effective to realize a sense enable bus system by combination of various logics.

According to the seventeenth aspect of the invention, a bus system having both functions of sense amplifier and latch can be realized by a small number of parts, and it is effective to decrease the power consumption and layout area.

According to the eighteenth aspect of the invention, a bus system having both functions of sense amplifier and latch can be realized by a small number of parts, and it is effective to decrease the power consumption and layout area.

According to the nineteenth aspect of the invention, after passing the first period, the output of the bus sense amplifier is in floating state, and the bus amplitude is small and stationary current does not flow, so that a bus sense amplifier of fast processing speed and low power consumption can be realized. Still more, elevation of the bus potential, hence the change of the second MOS transistor from ON to OFF state is smooth, and therefore the invention realizes a low power source noise characteristic with less influence by the power source noise. At the same time, the number of parts is small, and a bus sense amplifier with a small layout area is realized.

According to the twentieth aspect of the invention, it is possible to prevent the second MOS transistor from changing from OFF to ON state due to the influence of noise or the like during the second period to make an error operation thereof. Therefore, it is possible to increase the operation margin of the bus sense amplifier.

According to the twenty-first aspect of the invention, the operation margin can be easily enhanced by resistance division.

According to the twenty-second aspect of the invention, the bias can be dynamically cut off during the first period, and it is effective to easily enhance the operation margin without increasing the power consumption.

The invention is therefore intended to solve the above problems, and it is a first object thereof to realize a bus system or bus sense amplifier of high speed operation and low power consumption.

It is a second object to realize a bus system or bus sense amplifier of high accuracy, less affected by power source noise.

It is a third object to realize a bus system or bus sense amplifier of small layout area.

It is a fourth object to enhance the operation margin by stabilizing the bus potential raised by precharge.

It is a fifth object to realize a configuration of bus system capable of operating only part of bus systems, when using plural bus systems.

It is a sixth object to lower the power consumption further by further decreasing the bus amplitude.

It is a seventh object to increase the noise margin of a bus system of low power consumption and high speed outstandingly, by making use of pre-discharge to the contrary.

It is an eighth object to realize sense enable of the bus sense amplifier itself in various logics.

It is a ninth object to realize a bus system capable of completely preventing occurrence of penetration current.

Finally, it is a tenth object to realize a bus system also having a latch function.

These and other objects, features, aspects and advantages of the present invention will become more apparent from the following description of the present invention when taken in conjunction with the accompanying drawings.

DESCRIPTION OF THE PREFERRED EMBODIMENTS

Embodiment 1

Figure 1:
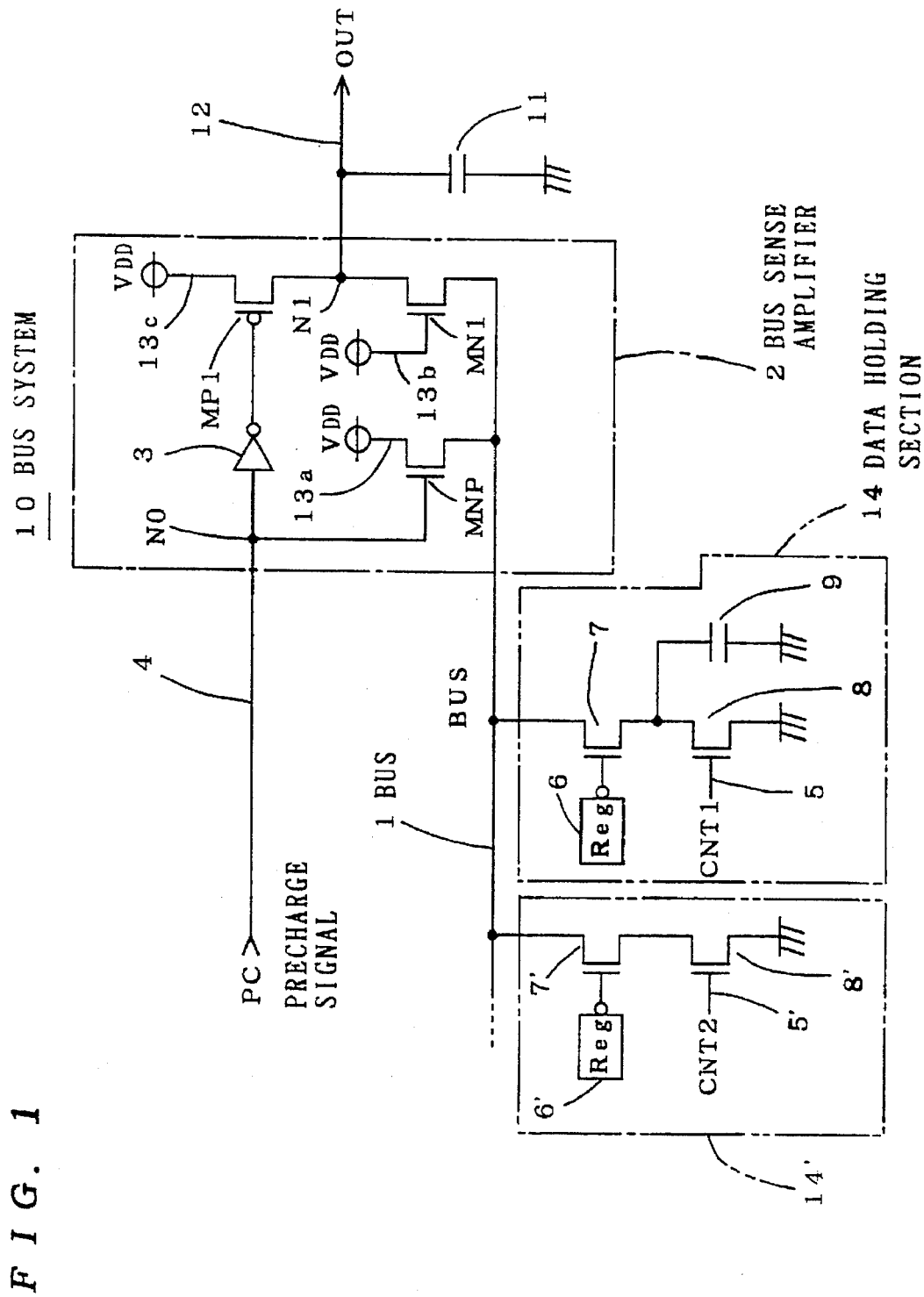
FIG. 1 is a circuit diagram of a bus system relating to embodiment 1 of the invention.

FIG. 1 is a circuit diagram showing a constitution of a bus system 10 as a first embodiment of the invention. As shown in the drawing, the bus system 10 roughly comprises a bus 1 (also indicated as BUS), plural data holding sections 14 (14') connected to the bus 1, and a bus sense amplifier 2. The parts 2, 14 (14') are composed as follows.

First, a precharge signal input line 4 inputs a precharge signal PC into the bus sense amplifier 2. Herein, the precharge signal PC is at high level (first level: hereinafter indicated as H level) in a first period (precharge period), and is successively at low level (second level: hereinafter indicated as L level) in a second period (EVL period), and it is a signal alternately repeating the first period and the second period, that is, H level and L level.

The bus sense amplifier 2 comprises an inverter 3 connected to the precharge signal input line 4 in node N0, p channel MOS transistor MP1 (corresponding to MOS transistor of second channel type or second polarity) of which gate electrode line is the output line of the inverter 3, an n channel MOS transistor MNP (MOS transistor of first channel type or first polarity) of source follower of which gate electrode is connected directly to the precharge signal input line 4 in node N0, and an n channel MOS transistor MN1. As for the n channel MOS transistor MNP (hereinafter called first MOS transistor), its drain region (one semiconductor region) is connected to a first power source line 13a at a power source potential $V_{DD}$, and its source region or the other semiconductor region is connected to the bus 1, respectively. As for the n channel MOS transistor MN1 (herein after called second MOS transistor), its gate electrode is connected to a second power source line 13b, its drain region is connected to an output line 12 through node N1, and its source region is connected to the bus 1, respectively. In this way, an ON level potential is applied to the gate electrode of the second MOS transistor MN1. Furthermore, as for the p channel MOS transistor MP1 (hereinafter called third MOS transistor), its source region (one semiconductor region) is connected to a third power source line 13c, and its drain region (other semiconductor region) is connected to an output line 12 through node N1, respectively.

Figure 22:
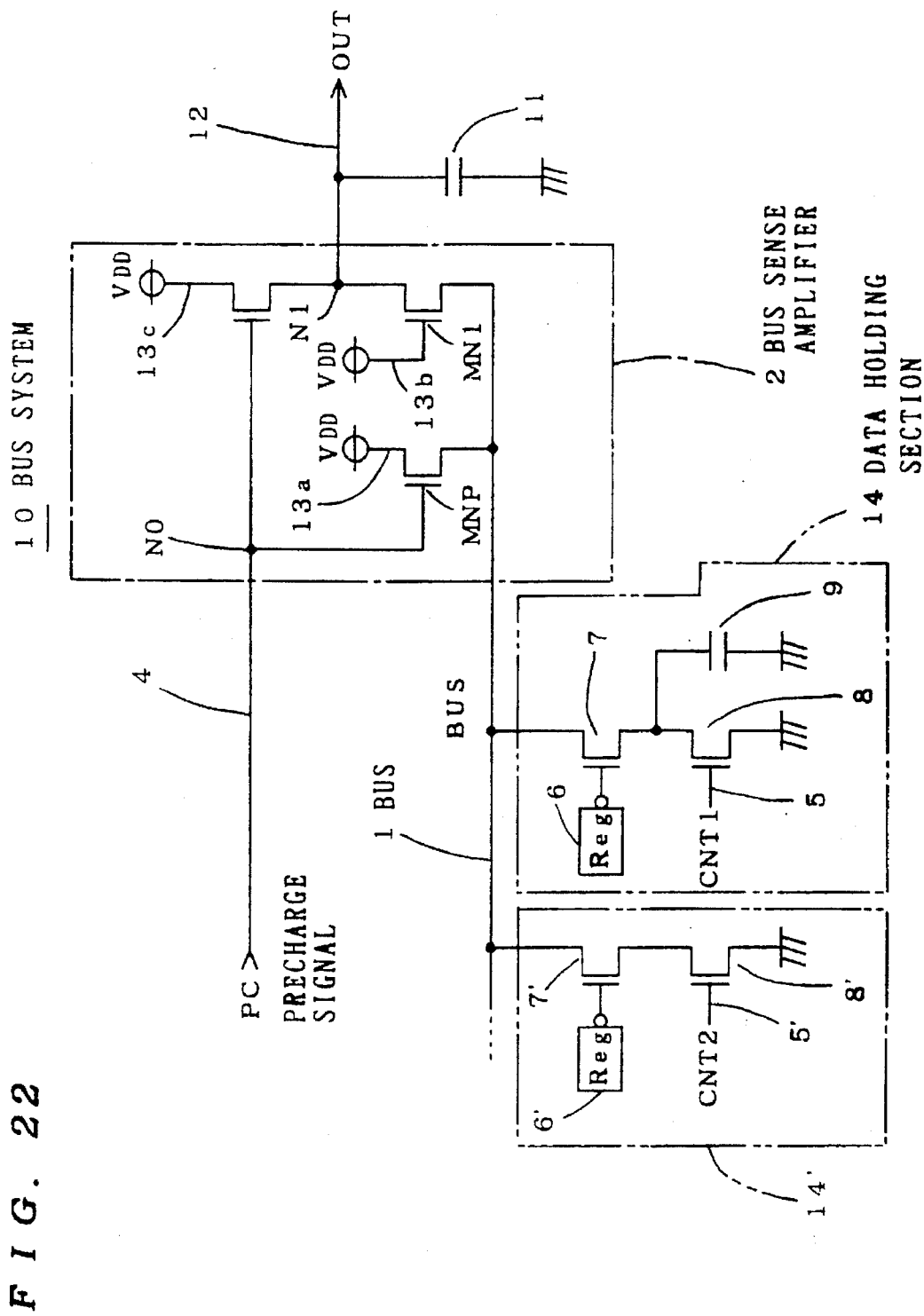
FIG. 22 is a circuit diagram of an equivalent bus system to the bus system shown in FIG. 1.

Instead of the combination with the inverter 3 and the third MOS transistor MP1, by the way, a n channel MOS transistor may be oneself used as a third MOS transistor, (as shown in FIG. 22.) This case, the gate electrode line of the n channel MOS transistor is directly connected to the precharge signal input line 4 at the node N0, and its drain region (one semiconductor region) and its source region (other semiconductor region) are connected to the power source line 13 and the output line 12, respectively.

From a different angle, the gate electrode line of the third MOS transistor MP1 used in FIG. 1 may be understood also as a gate electrode line including the inverter 3. In such understanding, all of first to third MOS transistors may be regarded as MOS transistors of such as type as to be logically ON when the precharge signal input line 4 is at H level.

Incidentally, the first to third power source lines 13a to 13c are connected commonly to an external power source potential $V_{DD}$ (equivalent to the first level), and the potential at the first level is supplied to the gate electrodes of the first to third MOS transistors MNP, MN1, MP1.

On the other hand, the data holding section 14(14') comprises a register 6(6') (of which output is provided with an inverter) for holding a data signal, an n channel MOS transistor 7(7') (fourth MOS transistor) having its gate electrode connected to the output of the corresponding register 6(6'), and drain region (one semiconductor region) to the bus 1, respectively, and an n channel MOS transistor 8(8') (fifth MOS transistor) having its gate electrode connected to control signal input line 5(5'), drain region (one semiconductor region) to the source region of the fourth MOS transistor 7(7'), and source region to the ground, respectively. The control signal input lines 5, 5' respectively input control signals CNT1, CNT1 (both are collectively called control signal CNT) which cause level change from L level to H level during the second period to the gate electrodes of the fifth MOS transistors 8,8'.

Capacities 9,11 are floating capacities of the bus 1 by Al wiring.

The bus sense amplifier 2 shown in FIG. 1 combines high impedance by precharge and level shift by NMOS transistor. Referring now to the timing chart in FIG. 2, the operation of the bus system 10 is explained below.

[1: Precharge state when precharge signal PC is at H level]

Figure 2:
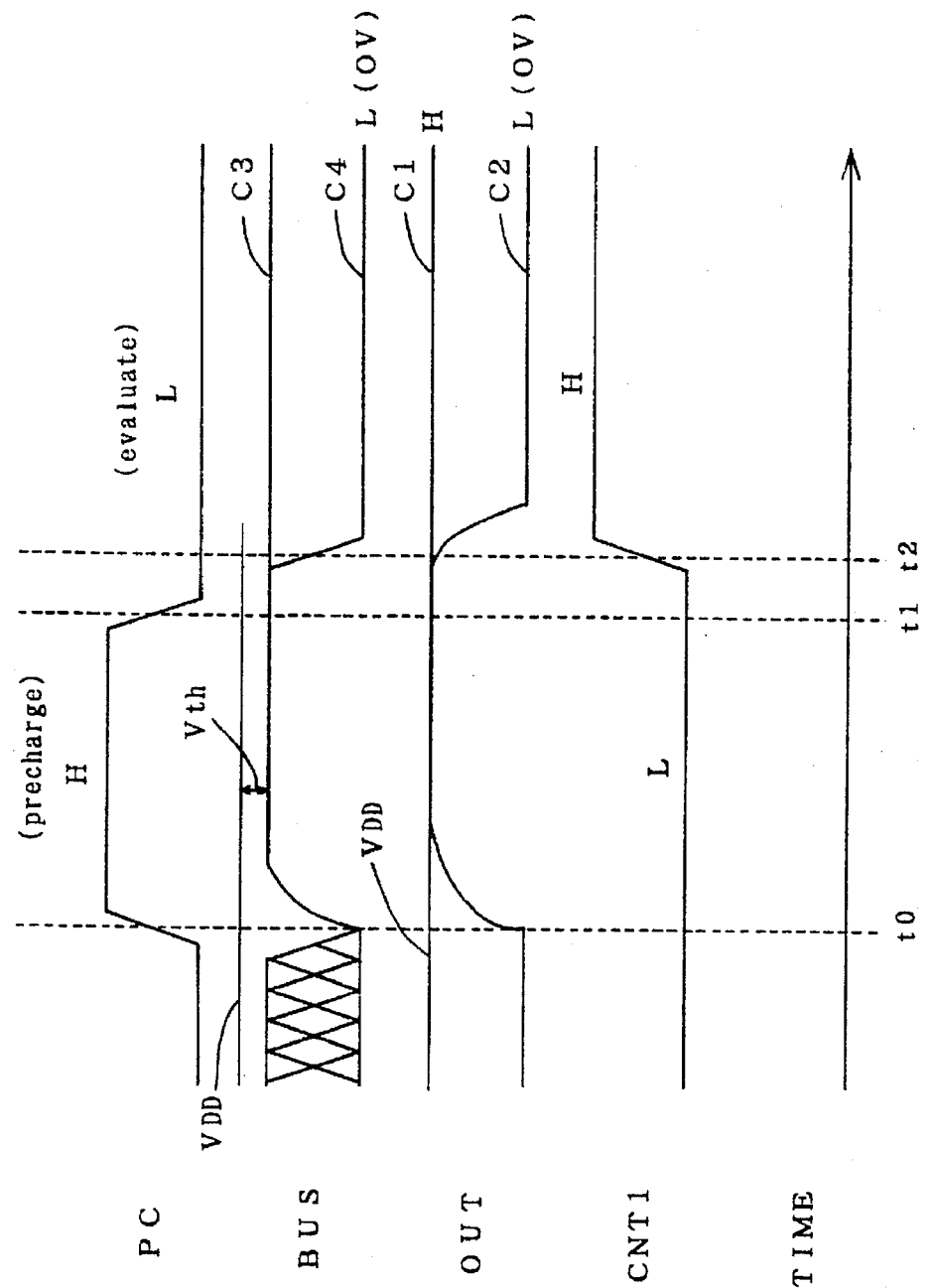
FIG. 2 is a timing chart showing the operation of the circuit in FIG. 1.

In FIG. 2, the first period from time $t_0$ to $t_1$ corresp state, and the precharge signal PC is at H level. At this time, the first and third MOS transistors MNP and MP1 are both turned on, and moreover by the back gate effect in the first MOS transistor MNP, the potential on the bus 1 is pulled up to the potential given in the formula $[V_{DD}-V_{th}(MNP)]$, where $V_{th}(MNP)$ is the threshold of the first MOS transistor MNP. For example, in the power source of $V_{DD}$=3.3 V, the potential of the bus BUS is about 2 V due to the back gate effect, and the amplitude is suppressed low.

Accordingly, the second MOS transistor MN1 is turned off, and the potential of the floating node N1 (abbreviated node N1) is pulled up to the power source potential $V_{DD}$ of H level by the ON state of the third MOS transistor MP1, and the capacity 11 is charged. Therefore the potential of the output line 12 or the output signal OUT becomes H level.

[2: EVL state when precharge signal PC is at L level, without data]

Wherein, at time t1, it is assumed that data is not held in each of the registers 6, 6', ... if the precharge signal PC becomes L level to be in the EVL state.

At this time, the potential of the bus 1 is not lowered, and hence the second MOS transistor MN1 remains being cut off, and the potential of the node N1 is maintained at potential $V_{DD}$ (H level). Hence, the output line 12 or output signal OUT remains at H level (see waveforms C1, C3 in FIG. 2).

[3: EVL state when precharge signal PC is at L level, with data]

When the precharge signal PC changes from H level to L level at time $t_2$, it becomes in EVL state (second period). To read out data value on the bus 1, the level of the control signal CNT of one register holding the data signal, within each of the registers 6, 6', ... in each data holding sections 14, 14', ... connected to the bus 1, is raised from L level to H level, and the bus 1 is connected to the ground line by the output of the one register. Herein, for example, it is supposed that the register 6 in FIG. 1 holds the data signal of L level, so that the register 6 corresponds to the one register.

At time $t_2$, when the control signal CNT1 changes to H level, the potential of the bus 1 starts to drop gradually from the potential $[V_{DD}-V_{th}(MNP)]$, and the second MOS transistor MN1 having ever be in cut-off state is set in conductive state. At this time, the third MOS transistor MP1 is in OFF state.

As a result, the potential of the node N1 having ever be in the floating state begins to drop by the current extracted by the cell in the corresponding register 6 flowing via the second MOS transistor MN1. In consequence, the electric charge in the capacity 11 is discharged. Hence, the level of the output line 12 or the output signal OUT is lowered to L level, and the data signal held in the register 6 is read out from the bus system 10 (see waveforms C2, C4 in FIG. 2).

The features of the bus system 10 include the following.

1: By the first MOS transistor MNP, the potential of bus BUS is less than the potential $V_{DD}$ (BUS<$V_{DD}$). Hence, the bus amplitude is suppressed small, and the power consumption is lowered.

2: The node N1 is in floating state after precharge, and hence high speed operation is enabled. In this system 10, moreover, it does not depend on the external supply voltage $V_{DD}$. The system 10 is free from mutual attraction of current unlike the prior art, and hence the operating speed is equivalent or higher.

3: Basically, there is no DC bus, and stationary current does not flow. Hence, the power consumption is low in this bus system 10.

4: During the precharge period, the operation change from ON to Off of the source followers, first MOS transistor MNP and second MOS transistor MN1, is smooth, and hence this bus system 10 is said to be a system of low power source noise.

5: The number of parts is smaller as compared with the prior art, and the layout area is smaller hence in this bus system 10.

As mentioned above, the bus sense amplifier 2 operates by discharging the precharged node N1 in response to the data signal held in the register 6. Herein, defining the DC gain by G=R×I, the resistance R of the precharge node N1 is infinite, and hence the DC gain is also infinite. Therefore, this bus sense amplifier 2 is very sensitive.

The size of each MOS transistor used in this bus system 10 may be at least large enough to drive the load of the next stage. In this respect, the speed is not always increased by increasing the size of the transistor. Therefore, in this system 10, the transistor size is enough, usually in the minimum size, or approximately Wp/Wn=6 (μm)/3 (μm) (supposing the gate length L is 0.5 μm). Hence, the layout area may be decreased.

In this system 10, the bus 1 is of such type as to be precharged, and hence in the EVL period when the potential of the bus BUS is in high impedance state, caution about noise is needed. Hence, it is required to consider whether to feed the control signal CNT of the register 6 side into the gate electrode of the upper MOS transistor in the NMOS transistor series, or to feed it into the gate electrode of the lower MOS transistor. When using the bus 1 as the bus itself, the number of transistor gates to be turned on simultaneously is regarded to be one at most, but when the bus 1 is used as OR gate, plural transistor gates can be turned on simultaneously, and it is necessary to prevent its charge coupling effect (generation of current flowing into the capacity 9 in FIG. 1 when there is no data of the register 6 during EVL period). In this case, if the held data in the register 6 is not changed during the EVL period, as shown in FIG. 1, the control signal CNT for controlling the bus should be entered in the gate electrode of the fifth MOS transistor 8 at the GND side.

In order that the operation shown in FIG. 2 is done normally, it is preferred that the matching of the threshold values $V_{th}$(MNP) and $V_{th}$(MN1) of the first MOS transistor MNP and second MOS transistor MN1 is guaranteed, or that the relation of $V_{th}$(MNP)<$V_{th}$(MN1) is established. That is, $V_{th}$(MNP)≦$V_{th}$(MN1).

This relation is established because the precharge level of the bus 1 is required to be a sufficiently high level for cutting off the second MOS transistor MN1. In other words, it may be considered that the bus sense amplifier is set very closely at the logic threshold value without margin. Hence, at least the first MOS transistor MNP and second MOS transistor MN1 should be disposed adjacently to each other on the layout. This point is not disclosed in the reference material of the prior art.

Incidentally, the same operation is obtained if the polarity (n channel or p channel) of the first to third MOS transistors MNP, MN1, MP1 is completely reverse to the case in FIG. 1 (changing n to p, and p to n). In this case, however, connection of Vdd and ground should be also inverted.

Modified Example of Embodiment 1

Figure 3:
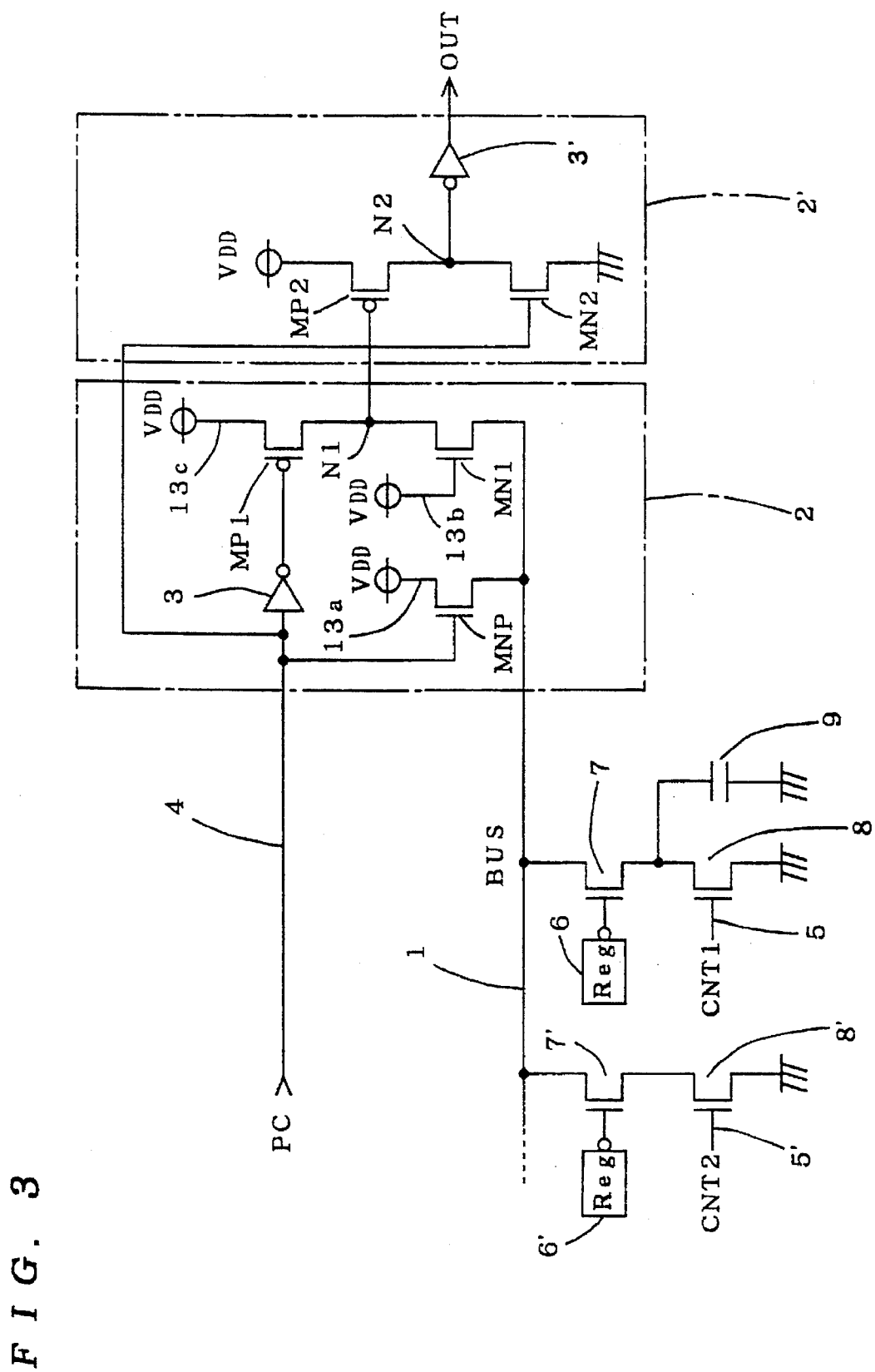
FIG. 3 is a circuit diagram of a bus system relating to a modified example of embodiment 1.

In FIG. 3, a buffer circuit part 2' is further provided in the output line 12 of the bus sense amplifier in embodiment 1. The buffer circuit part 2' comprises an inverter composed of n MOS transistor MN2 and p MOS transistor MP2 and an inverter 3'.

In the precharge state of PC=H, the node 2 is pulled down to the GND level (second level) by the n MOS transistor MN2, and hence the output signal OUT is at H level.

By contrast, when there is data signal in the register 6 in the ELV state of PC=L, the p MOS transistor MP2 conducts gradually by the voltage drop of node N1, and the floating capacity (not shown) occurring in the node N2 in the floating state is charged up. Hence the output signal OUT is lowered to L level.

If there is no data signal in the register 6 in the EVL state of PC=L, the p MOS transistor MP2 remains being cut off, and the potential of the node N2 is maintained at GND level, so that the output signal OUT remains at H level.

When the buffer circuit part 2' in FIG. 3 is disposed at the output side of the bus sense amplifier 2, the polarity of the third MOS transistor MP1 is preferred to be p channel.

To guarantee the bus system 10 in embodiment 1 more securely in design, it is preferred to employ the following embodiments. Such modified examples are sequentially described below.

Embodiment 2

Figure 4:
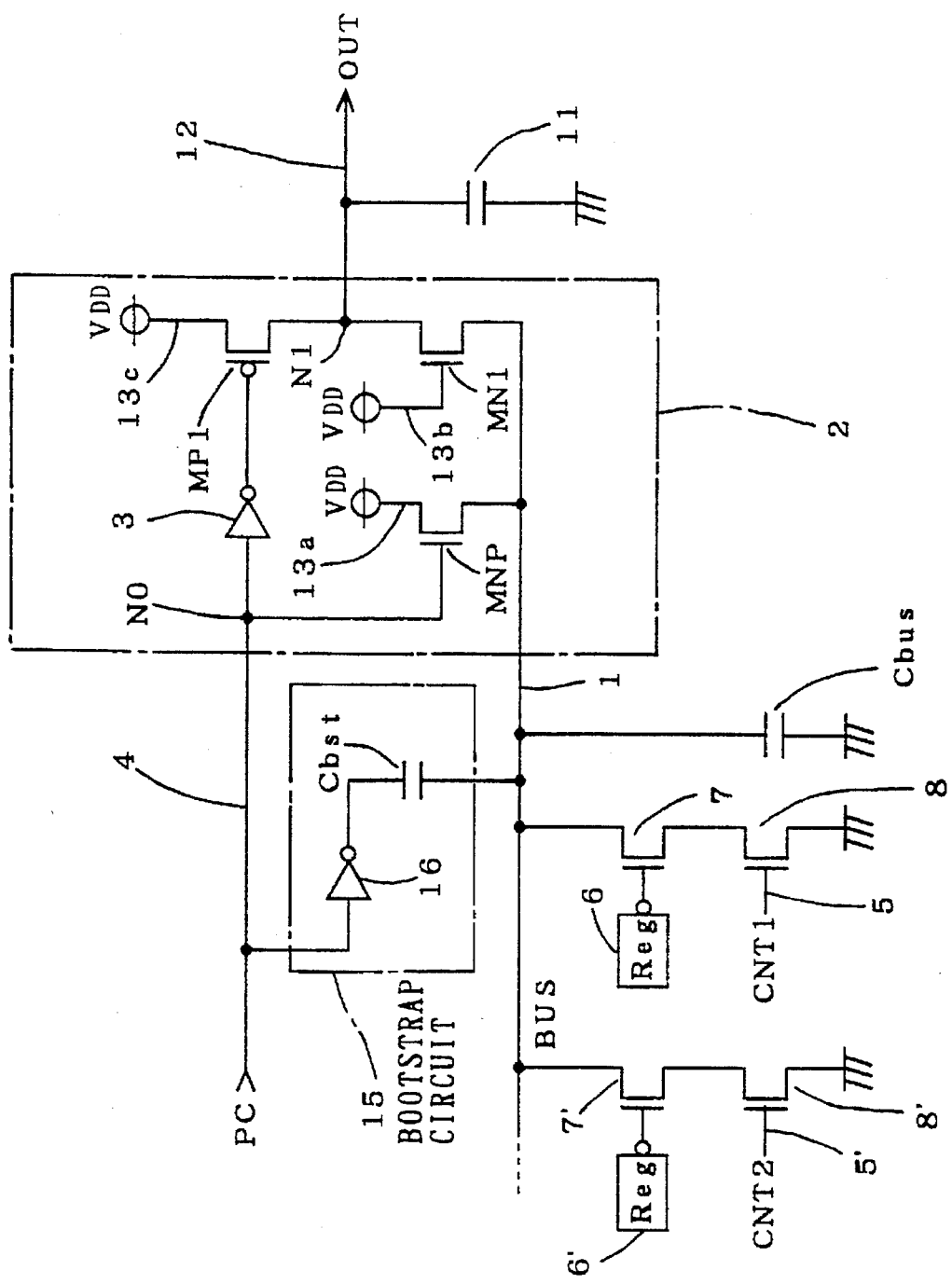
FIG. 4 is a circuit diagram of a bus system relating to embodiment 2.
Figure 5:
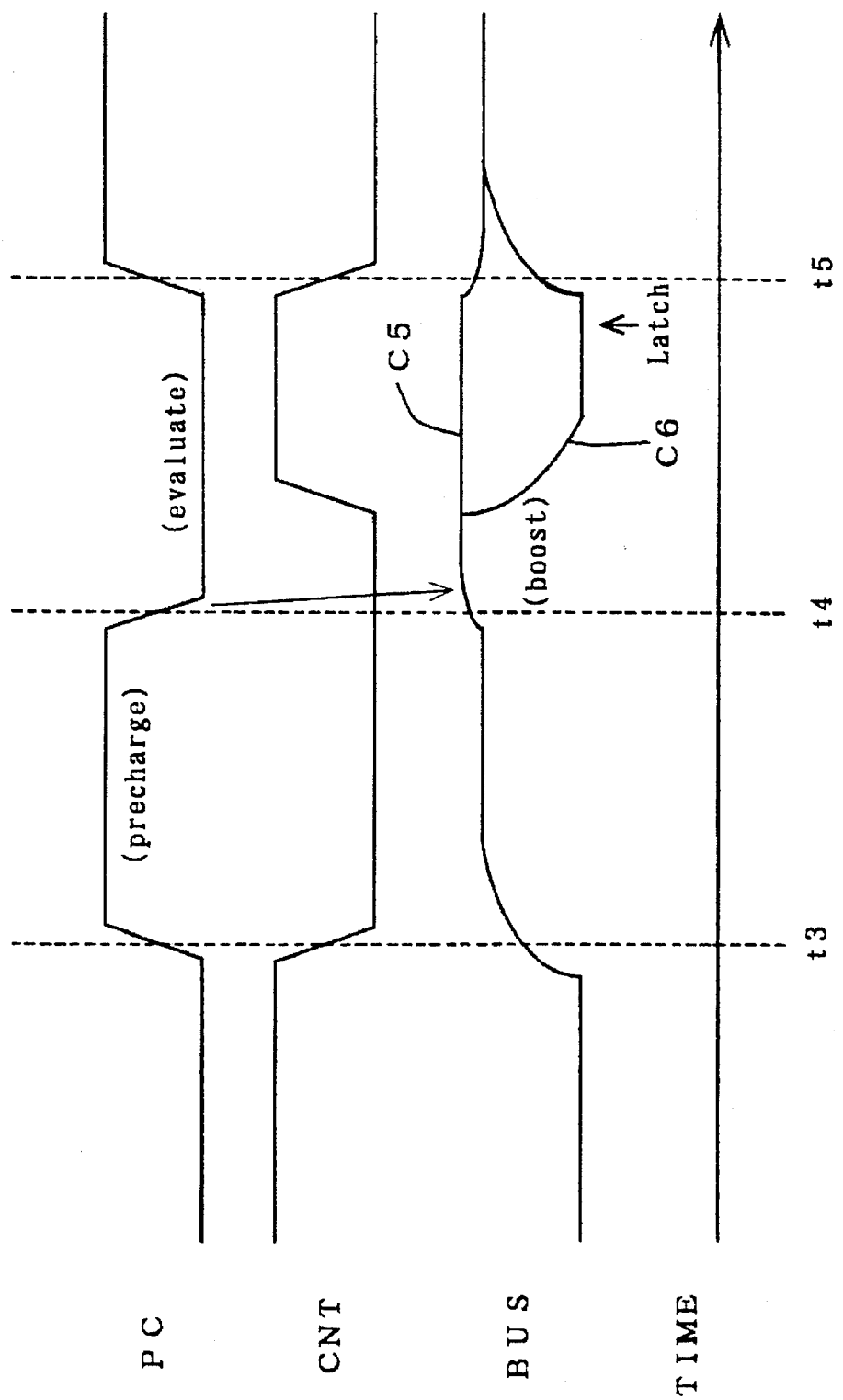
FIG. 5 is a timing chart showing the operation of the circuit in FIG. 4.

This is an application of the bootstrap system, of which structure is shown in FIG. 4, and the operation is given in the timing chart in FIG. 5.

The bus system in FIG. 4 differs from that in FIG. 1 only in that a bootstrap circuit 4 is provided. The bootstrap circuit 4 is composed of an inverter 16 connected to a precharge signal input line 4, and a capacity (i.e. capacitance) $C_{bst}$ of which one end is connected to the output of the inverter 16, and other end to the bus 1. The bootstrap circuit 4 is provided in order to prevent the potential of the bus BUS from lowering regardless of data reading-out to transfer the second MOS transistor MN1 from OFF state to ON state during the EVL period (second period) as mentioned below.

As shown in FIG. 4, when the bootstrap circuit 15 is added, during the precharge period, the capacity $C_{bst}$ is not charged due to the presence of the inverter 16, but in the EVL period, however, the capacity $C_{bst}$ is charged, and hence the precharge level of the bus 1 in the EVL period can be set slightly higher than the value obtained by pull-up of the first MOS transistor MNP [$V_{DD}$-$V_{th}$(MNP)] (the increment should be at least about 250 mV). In FIG. 5, when the potential of the bus BUS during the precharge period of time $t_3$ to $t_4$ is shifted to the EVL state at time $t_4$, it is slightly increased by the portion of voltage of the capacity $C_{bst}$. In FIG. 5, meanwhile, the bus waveforms C5, C6 in EVL period ($t_4$ to $t_5$) respectively represent the data absence and data presence state of the resister 6.

As a result, the cut-off of the second MOS transistor MN1 is guaranteed. That is, due to elevation of the potential of the bus BUS in the EVL period, in the absence of data, the first MOS transistor MN1 is prevented more effectively from being turned on due to noise or the like.

The capacity $C_{bst}$ for bootstrap is preferably realized, for example, between the gate and source or drain of transistor.

By the ratio of both capacities $C_{bst}$ and $C_{bus}$, the bootstrap voltage as increment of potential of the bus is adjusted.

Thus, in embodiment 2, the precharge level of the bus 1 is raised by the bootstrap system using the precharge signal PC. Hence, the design guarantee level is further enhanced.

Embodiment 3

In embodiment 3, the gate voltage control system is employed in embodiment 1.

If a proper bias is available, it may be considered to connect the gate of the second MOS transistor MN1 shown in FIG. 1 to the voltage line at less than power source voltage $V_{DD}$. This method is advantageous in that any particular hardware is not needed, but for bias generation, generally, a DC current is necessary, and it is highly possible that the power consumption may increase, which is opposite to the purpose of this invention of low power consumption. A proper method also considering this point is needed, and an example of such circuit is shown in FIG. 6.

Figure 6:
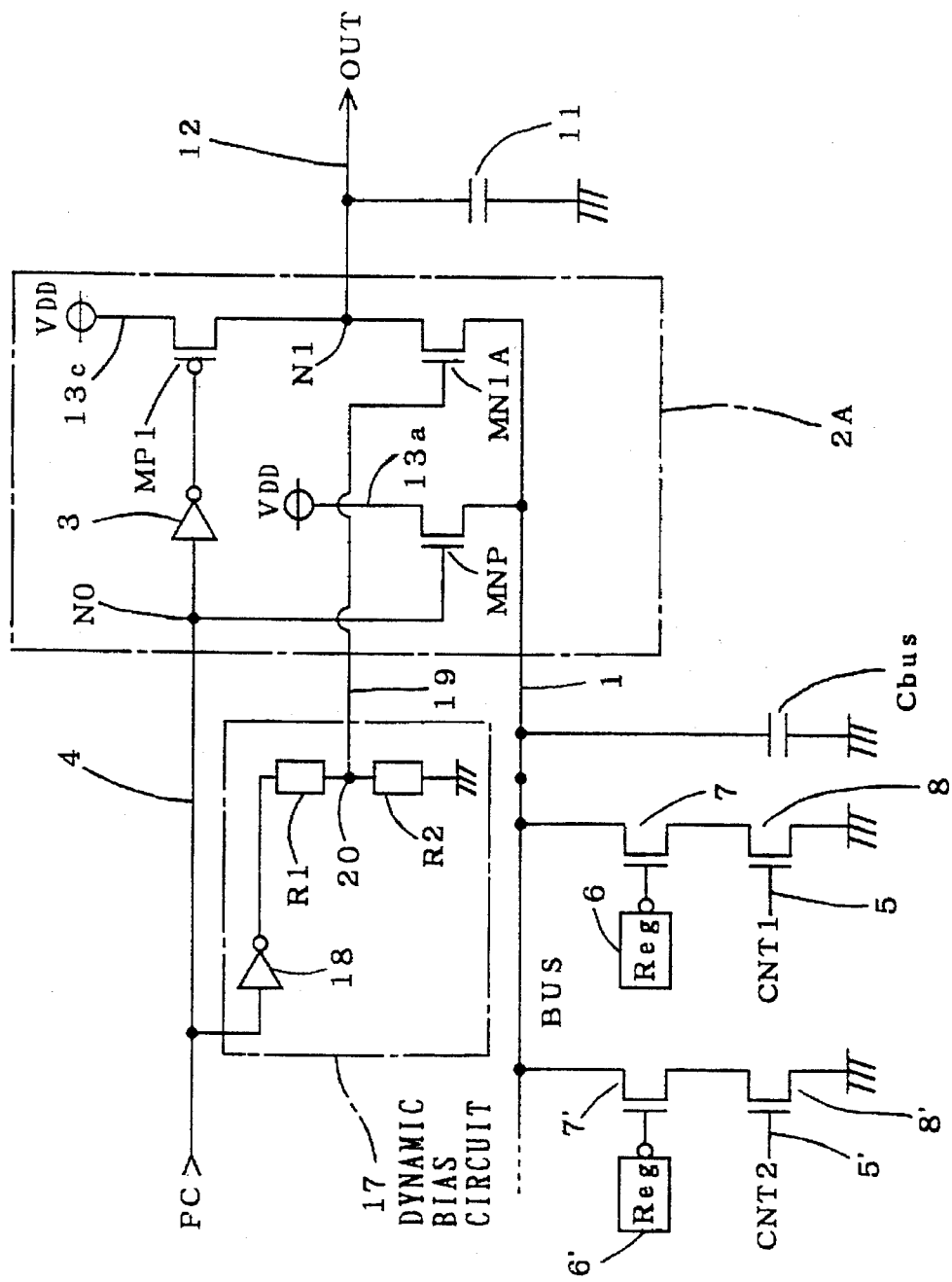
FIG. 6 is a circuit diagram of a bus system relating to embodiment 3.

What differs the bus system in FIG. 6 from that in FIG. 1 is that a dynamic bias circuit 17 is provided, and that a voltage line 19 connected to its node 20 is connected to the gate electrode of the second MOS transistor MN1A. Therefore the second power source line 13b in FIG. 1 is replaced, in embodiment 3 in FIG. 6, by a power source line consisting of a line for connecting the precharge signal input line 4 and the input of an inverter 18, the inverter 18, a line for connecting the output of the inverter 18 and the input of a first load element R1, the first load element R1, and the voltage line 19. Moreover, the corresponding gate electrode line of the second MOS transistor MN1A is at a potential corresponding to the first level only in the EVL period.

One of the features of the bus system in embodiment 3 is that the bias is cut off dynamically during the precharge period. That is, since the inverter 18 is not provided in the dynamic bias circuit 17, current does not flow into the first and second load elements R1, R2 during the precharge period.

On the other hand, during the EVL period, a current flows in the first and second load elements R1, R2, and hence the gate potential of the second MOS transistor MN1A becomes the value subtracting the portion of voltage drop at the first load element R1 from the power source potential $V_{DD}$. Its specific set value is about 250 mV lower than the power source potential $V_{DD}$, and hence the resistance ratio of the first and second load elements R1, R2 is set at about R1:R2=0.075:0.925.

Figure 7:
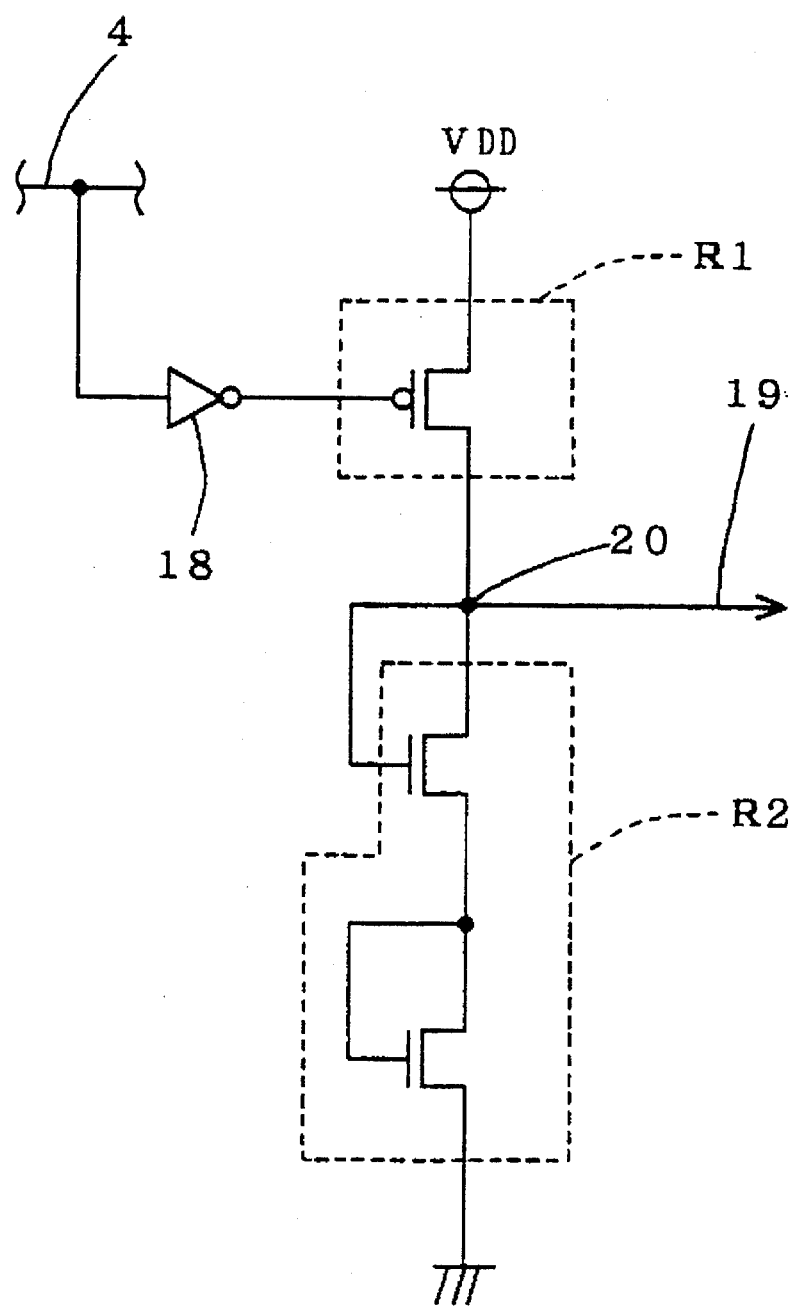
FIG. 7 is a circuit diagram showing an example of first and second load elements of a dynamic bias circuit.

The first and second load elements R1, R2 may be made of wiring of polysilicon and the like, or MOS FET. An example of the latter is shown in FIG. 7.

It can hence provide an operation margin of the bus sense amplifier 2A. That is, in FIG. 6, the second MOS transistor MN1A is turned on when the potential of its source region is equal to or less than $[V_{DD}-\alpha-V_{th}(MN1A)]$, where $\alpha$ denotes the voltage drop due to the first load element R1, and it is therefore more effective to prevent the second MOS transistor from changing from OFF state to ON state due to noise or other influence when there is no data in the EVL period. To wit, in the above case, the potential BUS of the bus is $[V_{DD}-V_{th}(MNP)]$, and the relation of $V_{th}(MNP) \leq V_{th}(MN1A)$ is established.

Summing up the constitution of embodiment 3, the features are as follows: the gate potential of the second MOS transistor MN1A is lower than the gate potential of the first MOS transistor MNP; the bias of the second MOS transistor MN1A is supplied by resistance division; and the bias is cut off dynamically by making use of the precharge signal PC.

Embodiment 4

Threshold values $V_{th}(MNP)$, $V_{th}(MN1)$ of the first and second MOS transistors MNP, MN1 in embodiment 1 are set at different values in the manufacturing process.

For example, different threshold values $V_{th}$ may be utilized by using transistors of different construction, such as 5-volt I/O transistor prepared optionally in the 0.5 μm CMOS process. That is, the operation margin is provided by selecting the first and second MOS transistors so that the relation may be $V_{th}(MNP) < V_{th}(MN1)$.

Embodiment 5

Figure 8:
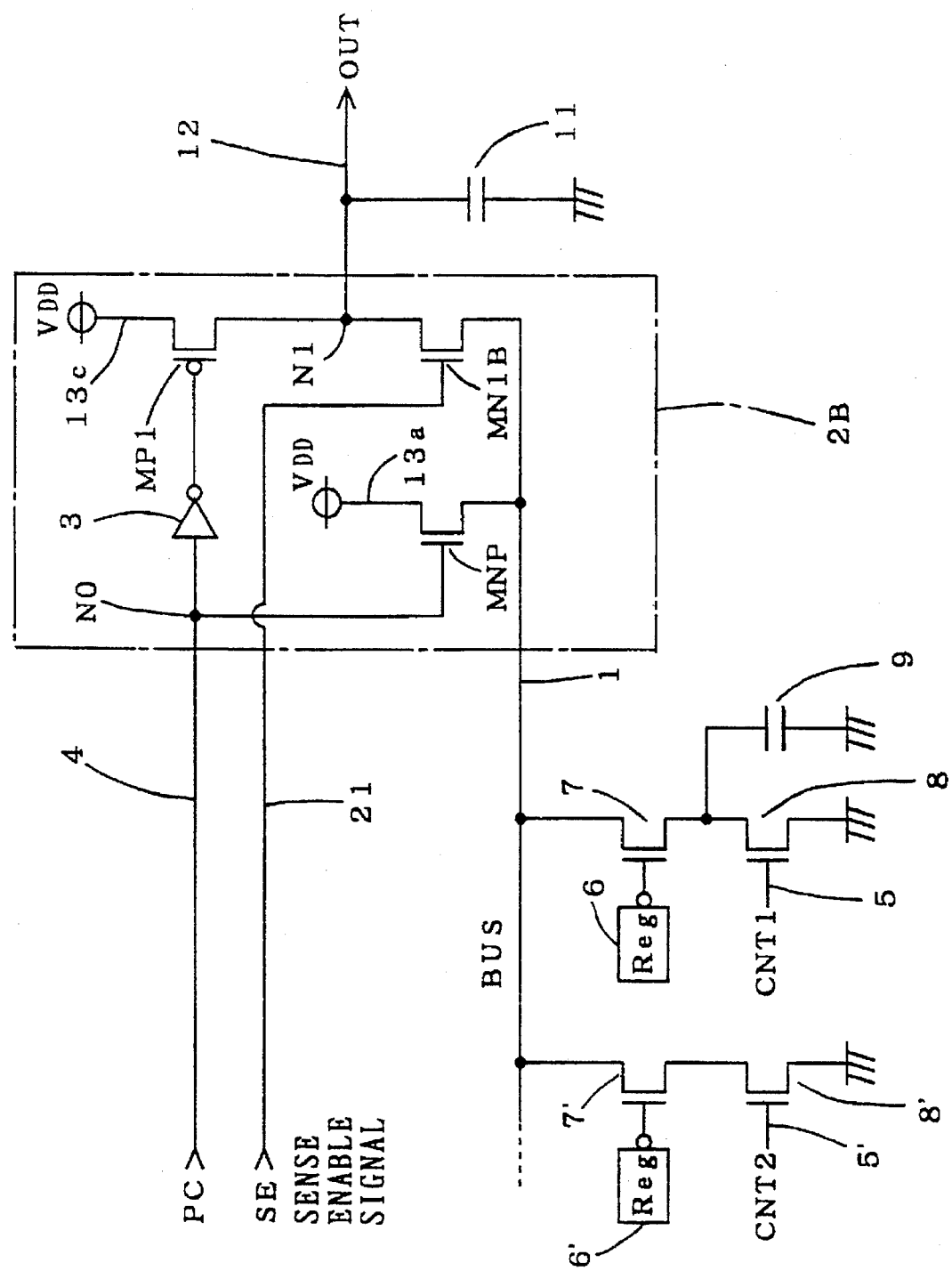
FIG. 8 is a circuit diagram of a bus system relating to embodiment 4.

This embodiment 5 relates to other method of utilizing the second MOS transistor MN1 in FIG. 1, and a bus system in this case is shown in FIG. 8.

Herein, as the gate electrode line of the second MOS transistor MN1B, a sense enable signal input line 21 for inputting a sense enable signal SE into the bus system is used. The sense enable signal SE is a signal of first or second level in one period of the precharge signal PC or in a longer period (specified period).

When the sense enable signal SE is at the first level, that is, H level, the bus sense amplifier 2 operates as described in embodiment 1. To the contrary, when the sense enable signal SE is at L level, the second MOS transistor MN1B is turned off, and the bus sense amplifier 2B does not make sense operation, and the output signal OUT is always at H level. It hence enables to control when the bus system is not desired to operate.

Figure 9:
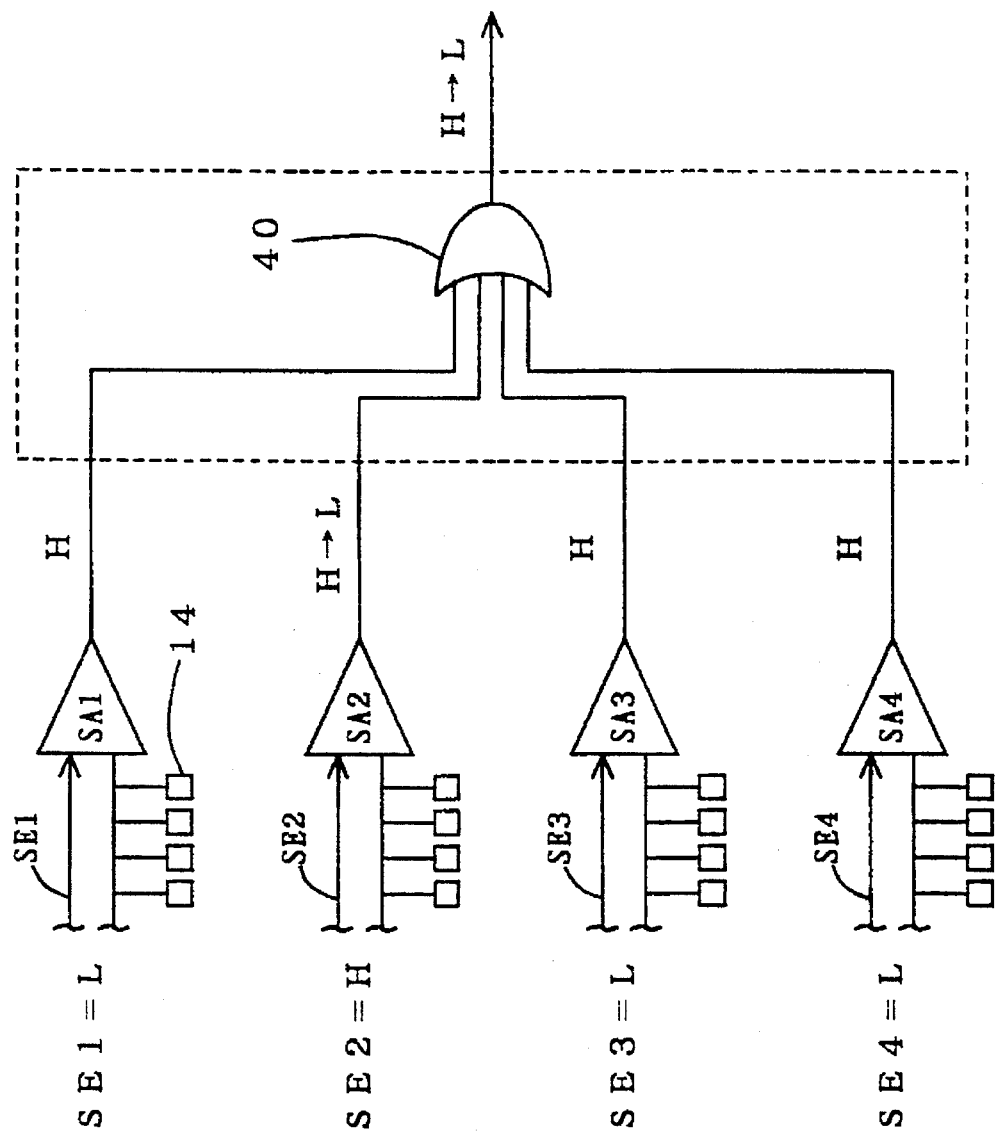
FIG. 9 is a diagram showing an application example of the bus system of embodiment 4.

For example, as shown in FIG. 9, using plural bus sense amplifiers SA1 to SA4, when operating only one bus sense amplifier among them, this embodiment 5 is effective. In the example in FIG. 9, only the sense enable signal SE is at H level, and hence only the output of the bus sense amplifier SA2 is at L level, and its output is selectively output by an OR circuit 40. Hence, the function of the bus sense amplifier is enhanced.

Embodiment 6

In embodiment 6, the polarity of the extraction transistor in embodiment 5 is changed from n type to p type. As a result, the extraction transistor can be provided at the bus side, and the lower limit of the L level of the potential of the bus BUS may be raised above 0 V (GND level), and the amplitude of the potential of the bus may be further reduced.

If there is an ample allowance in the operation speed, the extraction transistor of the register in the data holding section (corresponding to the fifth MOS transistor 8 in FIG. 8) may be changed from the N type MOS transistor to the P type MOS transistor, and it may be composed as a source follower. An example is shown in FIG. 10.

Figure 10:
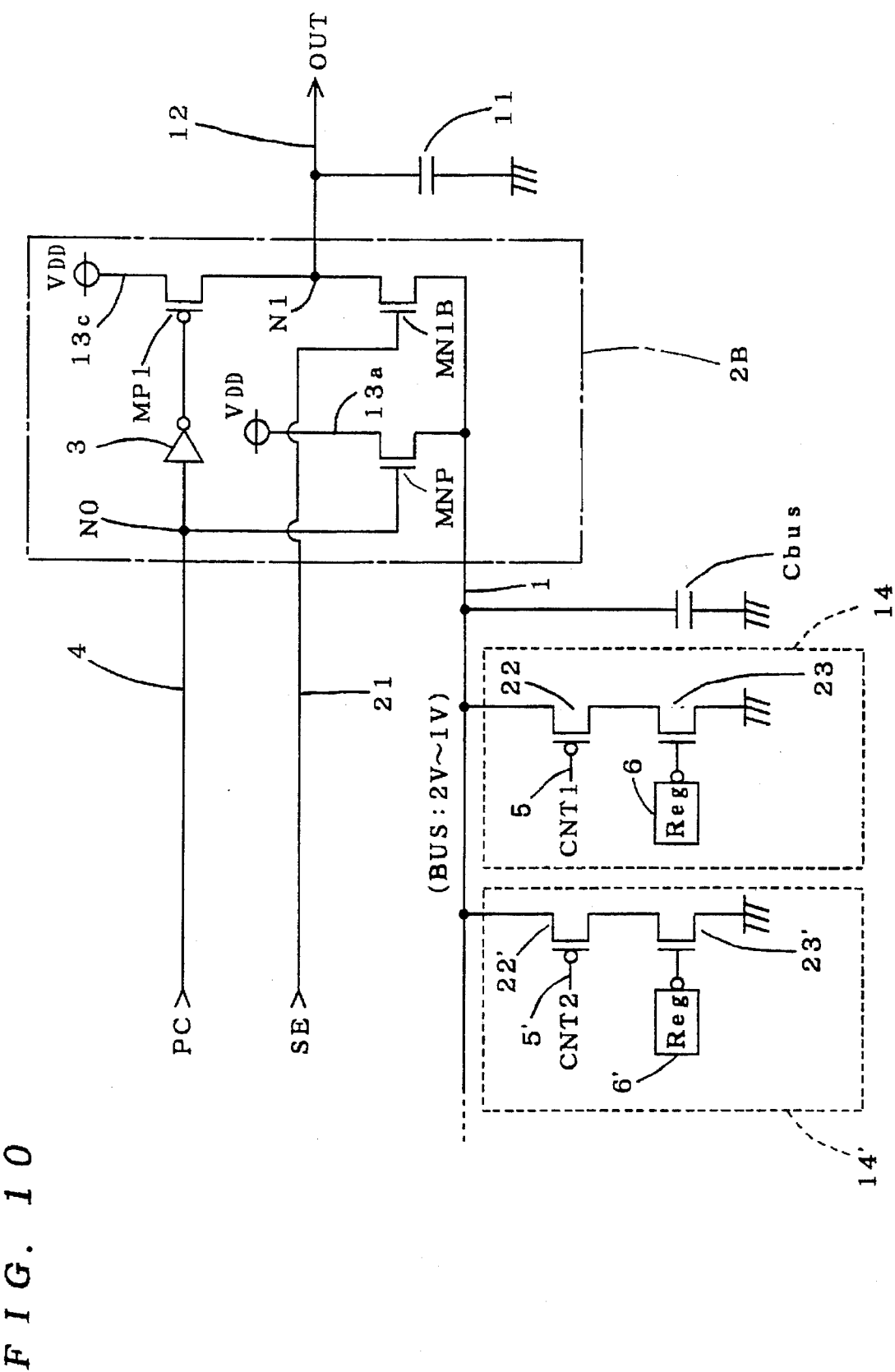
FIG. 10 is a circuit diagram of a bus system relating to embodiment 5.

What the bus system in FIG. 10 differs from that in FIG. 8 lies in the construction of the data holding sections 14,14'. That is, the data holding section 14 (14') comprises a register 6 (6'), a p channel MOS transistor 22 (22') as extraction transistor for issuing the data signal held by the register 6 (6') onto the bus 1, and an n channel MOS transistor 23 (23') (fourth MOS transistor) of which operation is controlled by the output line of the register 6 (6'). Reference numeral 5 (5') denotes a control signal input line, and CNT1, CNT2 are control signals. The source region of the p channel MOS transistor 22 (22') is connected to the bus 1, and as the control signal CNT1 (CNT2) is changed from H level to L level, the p channel MOS transistor 22 (22') is turned on accordingly.

Figure 11:
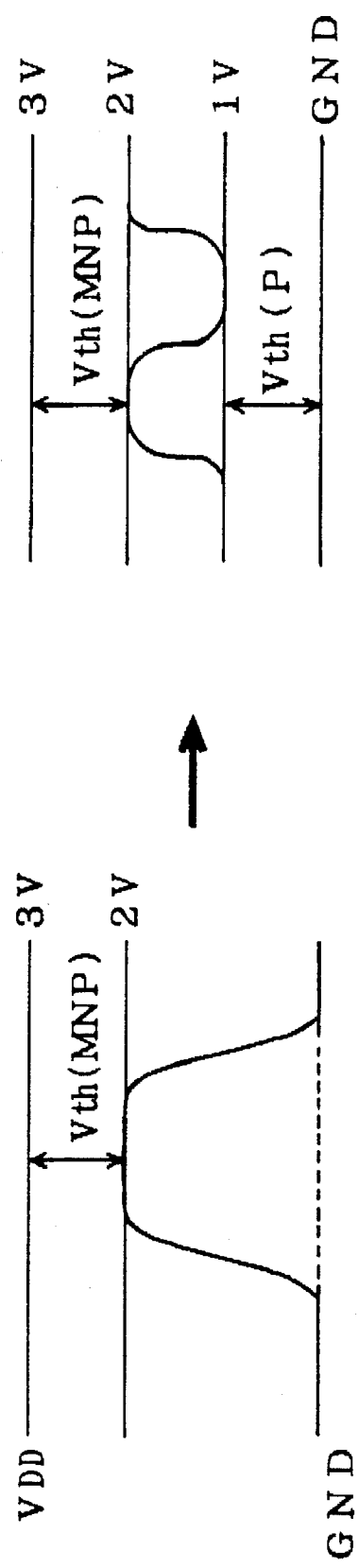
FIG. 11 is a diagram for describing the operation of embodiment 5.

Using this constitution, the bus amplitude is further lowered, and its amplitude is $[V_{DD}-V_{th}(MNP)]$ minus $|V_{th}(p)|$, so that the power consumption is further lowered. This is shown in FIG. 11. Herein, $V_{th}(p)$ is the threshold value of the p channel MOS transistor 22.

In embodiment 6, the constitution is described as a modified example of embodiment 5, but in its technical concept it is evident that the constitution of the data holding section 14 in FIG. 10 can be directly applied in the foregoing embodiments 1 to 5, and in such a case, too, further lowering of amplitude and further reduction of power consumption can be realized.

Embodiment 7

In embodiment 7, as compared with embodiments 1 to 6 in which the second MOS transistor MN1 is the source input type, the precharge level of the bus is the GND.

In the sense of decreasing the amplitude of the bus potential, the precharge level may be set at GND level, and the pull-up level of the register at [$V_{DD}-V_{th}$(MNP)]. In such a case, the constitution of the bus system is as shown in the circuit configuration in FIG. 12.

As shown in the diagram, a data holding section 50 (50') comprises a register 6 (6') for holding data, a p channel MOS transistor 24 (fifth MOS transistor) having its gate electrode connected to the output of the register 6 (6') and its source region connected to the power source potential $V_{DD}$, and an n channel MOS transistor 25 (fourth MOS transistor) having its gate electrode connected to a control signal input line 5, its drain region connected to the drain region of the fifth MOS transistor 24, and its source region connected to the bus 1. As the fifth MOS transistor 24, the n channel MOS transistor may be used. Hence, the logic may be inverted. Besides, the layout positions of the fourth and fifth MOS transistors 25, 24 may be inverted. Herein, the features and functions of the data holding section 50 (50') are, as mentioned later, to change the potential of the bus gradually from the ground level (second level) to the first level by the data output of the register 6 (6') during the EVL period.

On the other hand, the bus sense amplifier 2C comprises an n type first MOS transistor MNPC, an n type second MOS transistor MN1C, an inverter 3, and a p type third MOS transistor MP1. Incidentally, a capacity 11 is, same as a capacity $C_{bus}$, is a floating capacity by an aluminum line. The gate electrode of the first MOS transistor MNPC is connected to a precharge signal input line 4, its drain region to the bus 1, and its source region to the ground (GND), respectively. Similarly, the gate electrode of the second MOS transistor MN1C is connected to the bus 1 and its drain region to an output line 12 through node N1, respectively. The third MOS transistor MP1 is a corresponding third MOS transistor in FIG. 1. Therefore, instead of the third MOS transistor MP1 and inverter 3, an n channel MOS transistor may be used as third MOS transistor.

Figure 13:
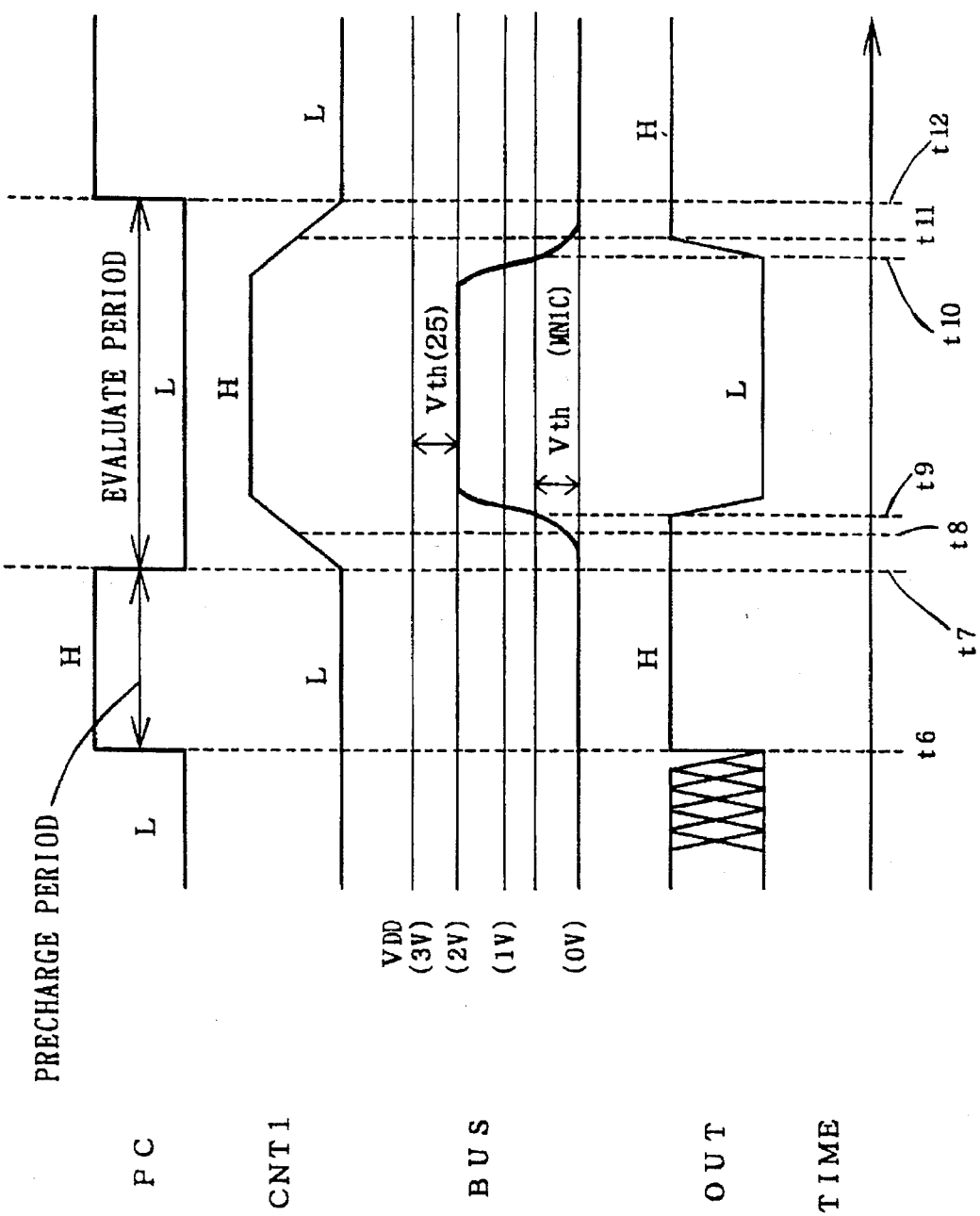
FIG. 13 is a timing chart showing the operation of the circuit in FIG. 12.

The operation of this bus system and bus sense amplifier 2C is described below according to the timing chart in FIG. 13.

First, in the precharge period of time $t_6$ to $t_7$ (herein, substantially, this is a predischarge period) (the level of PC signal is H level or first level), the first MOS transistor MNPC is in ON state, and the potential of the bus BUS is at 0 V (ground level). Accordingly, the second MOS transistor MN1C is turned off. On the other hand, the third MOS transistor MP1 is turned on, and therefore the potential of the node N1 becomes H level, and the output signal OUT becomes H level.

The operation in the EVL period from time $t_7$ to $t_{12}$ is as follows. First, at time $t_7$, it is supposed that the control signal CNT rises from L level to H level. Herein, the data signal at L level is held in the register 6, and it is assumed CNT= CNT1.

At time $t_8$, in response to the level change of the control signal CNT1, the fourth MOS transistor 25 is turned on, and the potential of the bus BUS is gradually raised from 0 V to [$V_{DD}-V_{th}$(25)], where $V_{th}$(25) is the threshold value of the fourth MOS transistor 25.

The threshold value of the second MOS transistor MN1C, $V_{th}$(MN1C), is set at, for example, 0.7 V, and accordingly at time $t_9$ when the potential of the bus BUS is raised up to $V_{th}$(MN1C), the second MOS transistor MN1C is changed from OFF state to ON state, and the floating capacity 11 is discharged, so that the potential of the floating node N1 changes to L level. As a result, the output signal OUT corresponding to the data of the register 6 is output onto the output line 12. Afterwards, when the potential of the bus BUS reaches [$V_{DD-Vth}$(25)], the fourth MOS transistor 25 is turned off.

The operation at time $t_{10}$, $t_{11}$, $t_{12}$ is reverse to the above operation.

Thus, in this bus system, owing to the pull-up system of the bus potential by the NMOS source follower, noise is hardly formed in the current waveform. This respect is same as in the foregoing bus systems. In the circuit in FIG. 12, too, without passing DC current, the level of the output signal OUT corresponding to the bus signal of low amplitude can be recovered to the full level of the CMOS transistor. The judging threshold value of the bus potential is, same as mentioned above, $V_{th}$(MN1C)=0.7 V, and the operation speed is slightly slow, but this bus system has a merit of increasing the noise margin.

Figure 12:
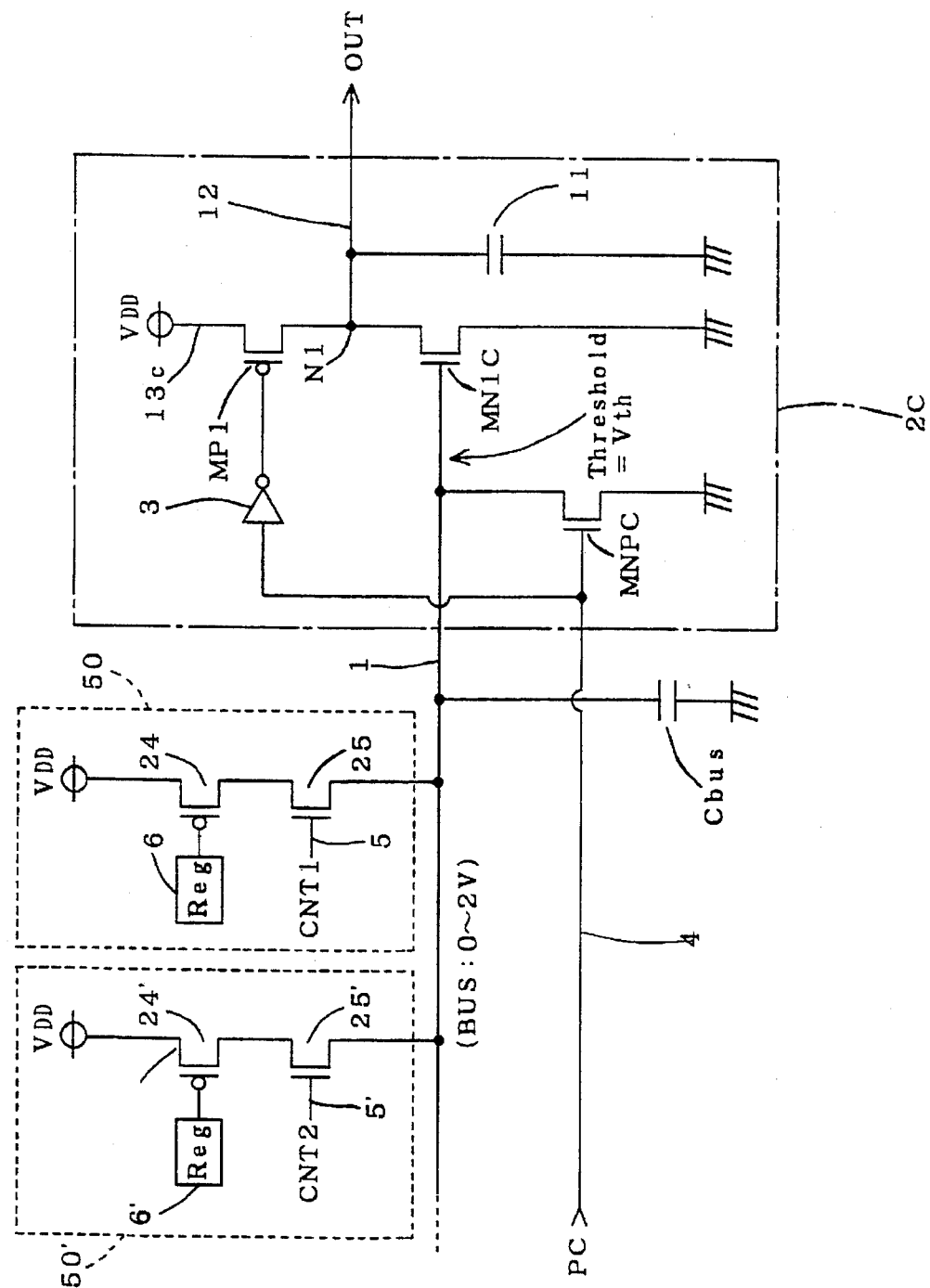
FIG. 12 is a circuit diagram of a bus system relating to embodiment 6.

The operation is same in the circuit by completely inverting the polarity (P channel and N channel) of each MOS transistor shown in FIG. 12.

Modified Example of Embodiment 7

Figure 14:
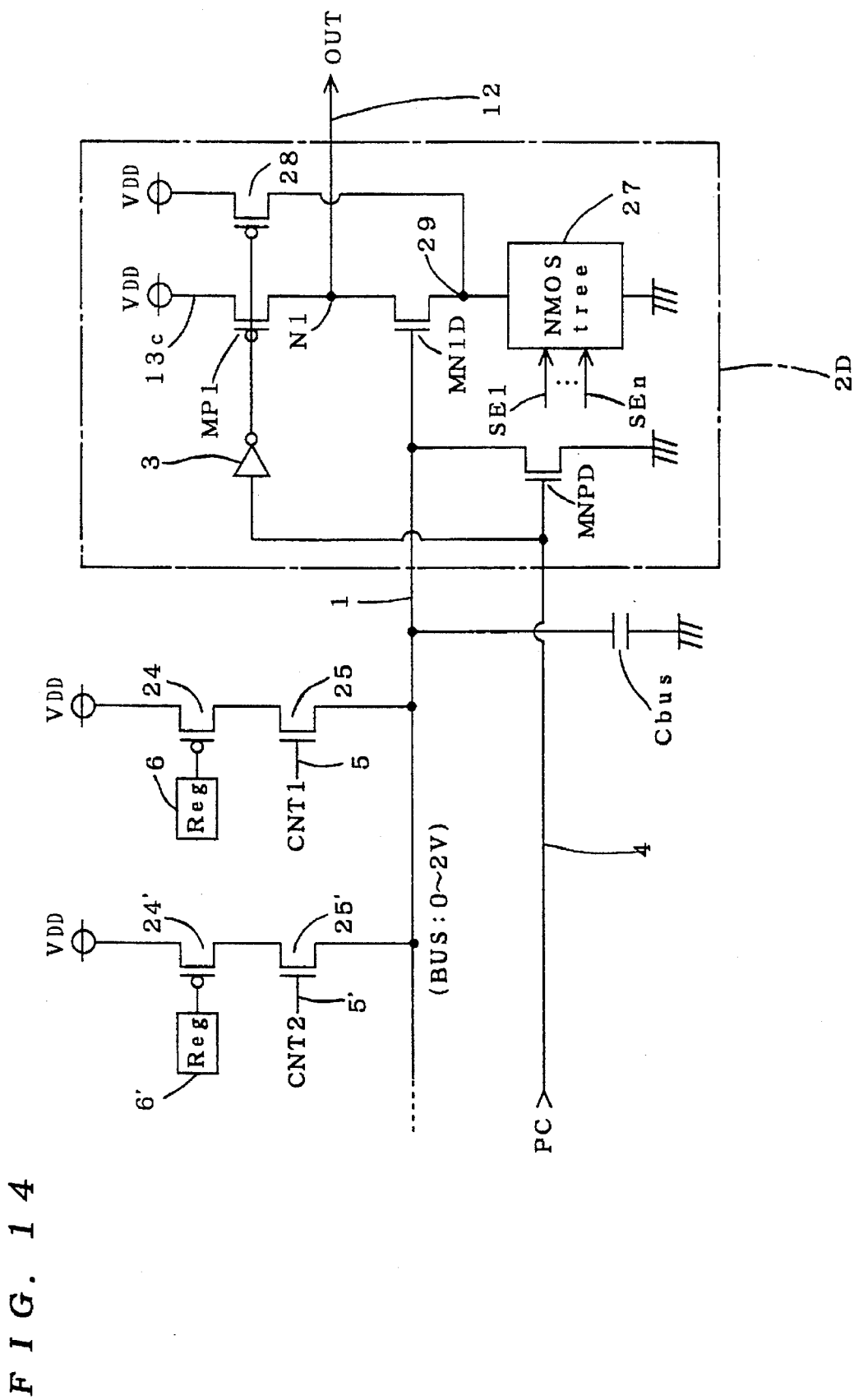
FIG. 14 is a circuit diagram of a bus system relating to embodiment 7.

By incorporating a logic in an NMOS tree at the source region side of the second MOS transistor MN1C in FIG. 12, the bus sense amplifier can enable the sense in various logics. A structural example of bus sense amplifier 2E in this case is shown in FIG. 14.

In an NMOS tree 27, n sense enable signals SE1 to SEn are entered. In the upper part of the NMOS tree 27, a p MOS transistor 28 is provided so as to prevent malfunction in load redistribution, and the potential of a node 29 is kept at H level to precharge for safety precaution.

Figure 15:
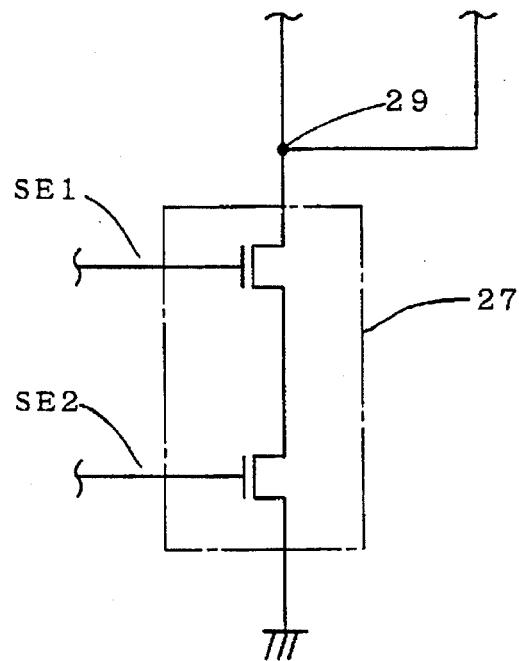
FIG. 15 is a circuit diagram showing an example of NMOS tree.
Figure 16:
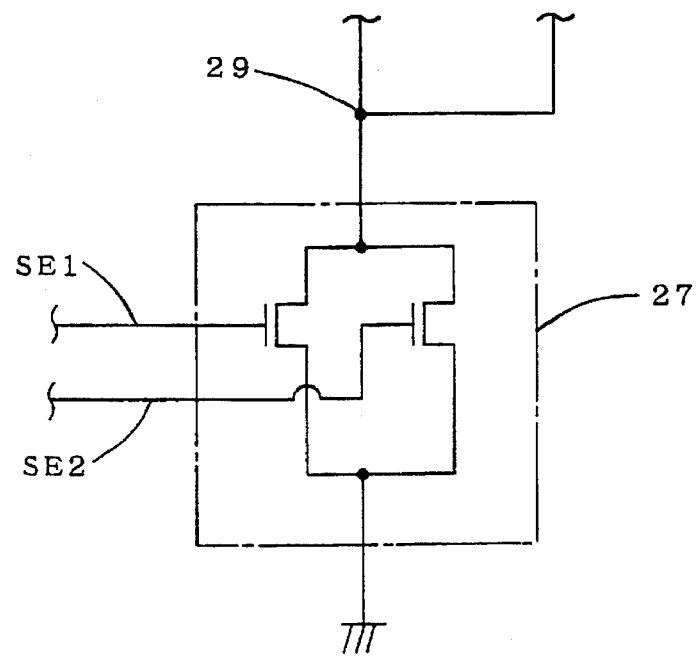
FIG. 16 is a circuit diagram showing an example of NMOS tree.

For example, as shown in FIG. 15, when the NMOS tree 27 is composed of two NMOS transistors proveded in series, the sense is enabled by the logical product (AND) of sense enable signals SE1, SE2 entered in the gate electrodes of these NMOS transistors, or, as shown in FIG. 16, when the NMOS tree 27 is composed of parallel connection of two NMOS transistors, this bus sense amplifier 2D enables the sense by the logical sum (OR).

Embodiment 8

Figure 17:
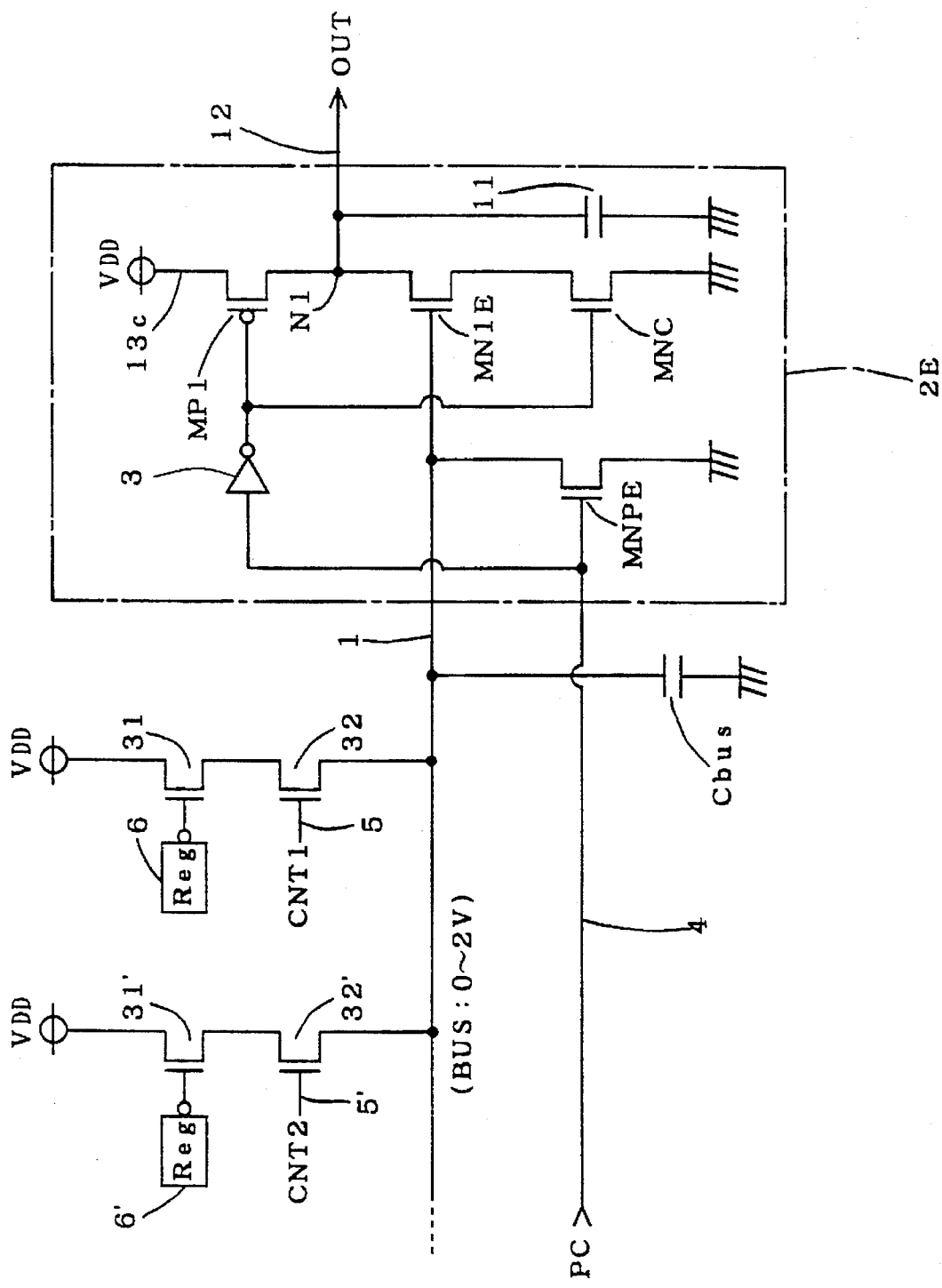
FIG. 17 is a circuit diagram of a bus system relating to embodiment 8.

In embodiment 8, it is intended to decrease the penetration current, and a structural example of the bus sense amplifier 2E in this case is shown in FIG. 17.

In the example in FIG. 17, as compared with the basic circuit shown in FIG. 12, a sixth MOS transistor MNC is added. The mason is as follows.

That is, usually many loads are connected to the bus 1, and it takes a considerable time to precharge the potential of the bus BUS (in this case, substantially, discharging to the GND level). Accordingly, by inserting the sixth MOS transistor MNC between the source region of the second MOS transistor MN1E and the ground, the third MOS transistor MP1 is turned on simultaneously when the precharge signal PC is entered, while the six MOS transistor MNC is turned off. Therefore, if it takes a long time to extract the potential of the bus 1 from H level to the GND level by the first MOS transistor MNPE and, as a result, the second MOS transistor MN1E and third MOS transistor MP1 are turned on simultaneously, since the sixth MOS transistor MNC is turned off, flow of penetration current can be prevented. This is a great merit contributing to lowering of power consumption.

Figure 18:
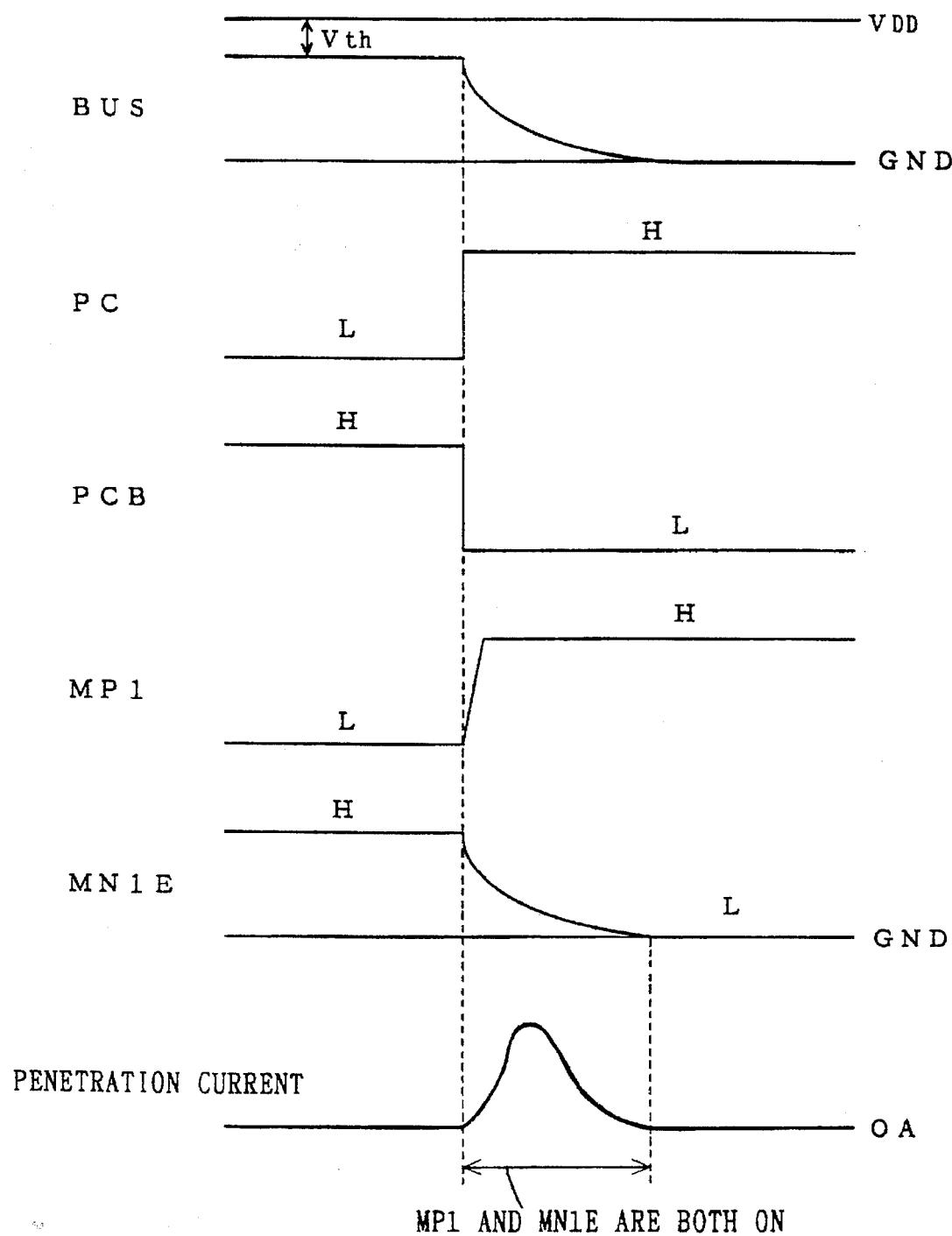
FIG. 18 is a timing chart pointing out the problems.

For reference, the operation timing indicating the problem when the sixth MOS transistor MNC is not provided is shown in FIG. 18.

Meanwhile, in FIG. 17, to connect the output of the register 6(6') to the bus 1, two series NMOS transistors 31, 32 (31',32') are used. Relating to these fifth and fourth MOS transistors 31, 32 (31',32'), it is possible to lay out by sharing the source of the former and the drain of the latter, and hence the layout efficiency is better than in the combination of the P type MOS transistor and N type MOS transistor in FIG. 14.

Embodiment 9

In embodiment 9, a latch circuit is further added to the output side of the bus sense amplifier.

The circuit of the bus systems mentioned so far is designed to function as sense amplifier, and generally the output line OUT of the bus sense amplifier is further connected to an external latch. Accordingly, when the sense amplifier and latch can be integrated, the merit seems to be great in both electric power and layout area.

Figure 19:
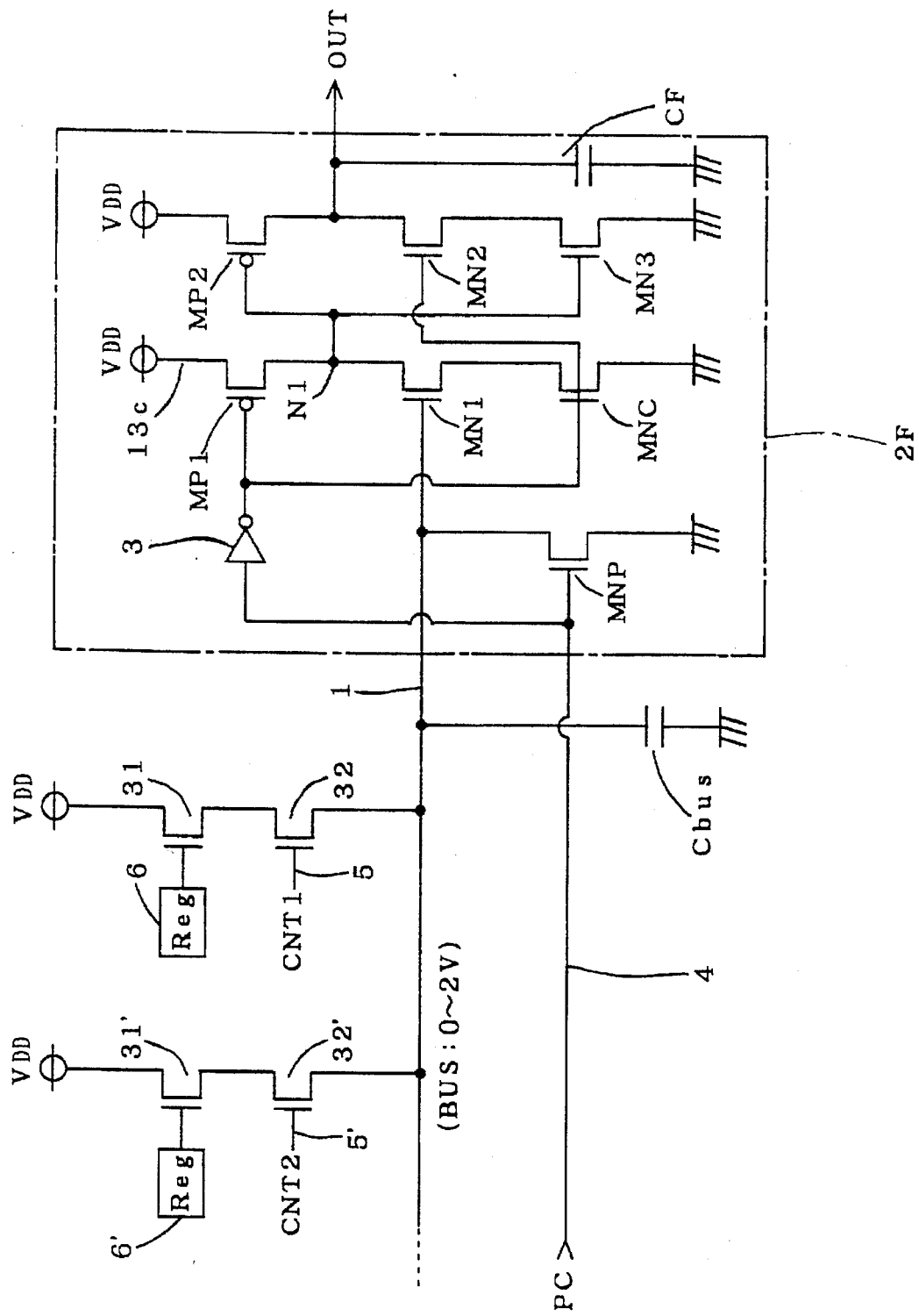
FIG. 19 is a circuit diagram of a bus system relating to embodiment 9.

This is realized in the structural example shown in FIG. 19. As shown in the diagram, newly added are a p channel MOS transistor MP2 (seventh MOS transistor) and an n channel MOS transistor NM3 (ninth MOS transistor) having their gate electrodes connected to node N1, and an n channel MOS transistor MN2 (eighth MOS transistor) having its gate electrode connected to the output line of the inverter 3, its drain region to the drain region of the seventh MOS transistor MP2, and its source region to the drain region of the ninth MOS transistor MN3, respectively. In the diagram, capacity $C_F$ is a floating capacity by an Al (alminum) line. Meanwhile, the sixth MOS transistor MNC is not an essential element in embodiment 9, and hence may be omitted.

Figure 20:
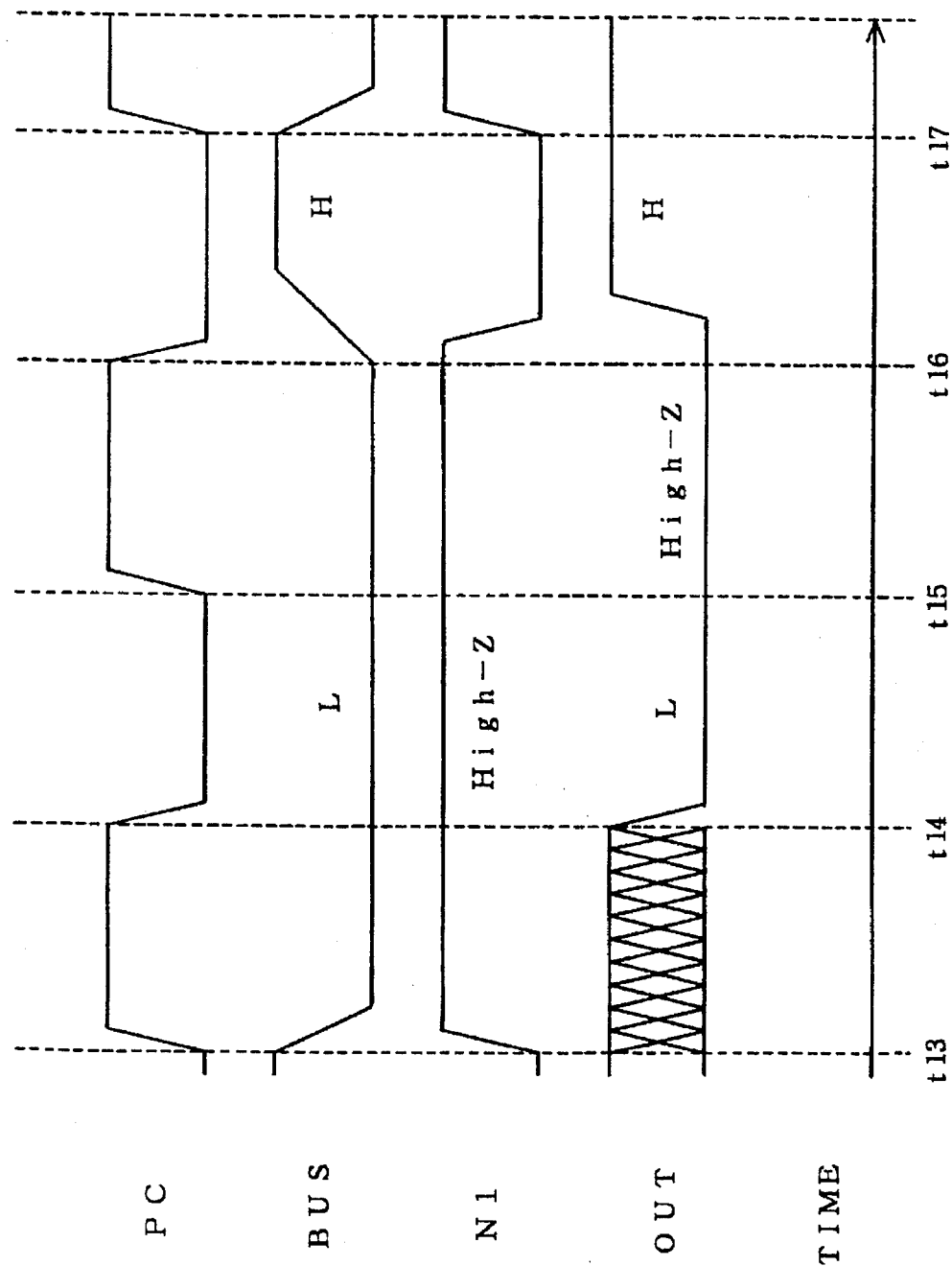
FIG. 20 is a timing chart showing the operation of the circuit in FIG. 19.
Figure 21:
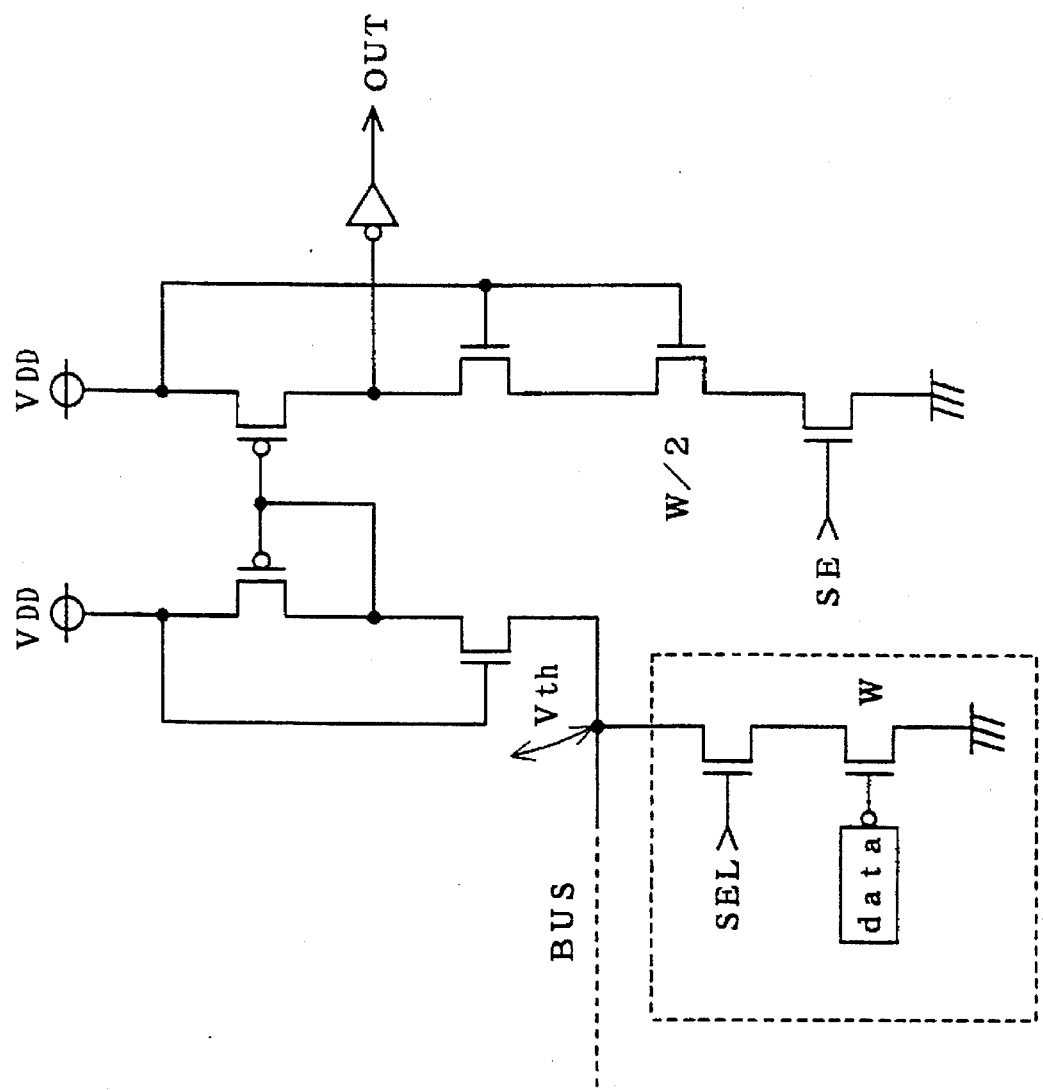
FIG. 21 is a diagram showing a prior art.

The operation timing of the circuit in FIG. 19 is shown in FIG. 20. The operation is described below by referring to FIG. 19 and FIG. 20.

First, after the precharge period of time $t_{13}$ to $t_{14}$, the potential of the bus BUS is supposed to be at L level. For example, the control signal CNT1 is changed to H level but there is not data in the register 6. At this time, the node N1 remains at H level, and the eighth and ninth MOS transistors MN2, MN3 are turned on, and hence the output signal OUT becomes L level (time $t_{14}$ to $t_{15}$).

In the next precharge period (time $t_{15}$ to $t_{16}$), both seventh and eighth MOS transistors MP2, MN2 are turned off, and the route for discharging the output signal OUT is cut off, and therefore the output signal OUT is latched still at H level.

In the next EVL period (time $t_{16}$ to $t_{17}$), supposing the control signal CNT2 is changed from L level to H level to output the data signal in the register 6' onto the bus 1, the potential of the bus BUS is gradually raised to H level, and hence the potential of the node N1 drops to L level, and accordingly the output signal OUT gradually rises to H level, thereby reaching H level. After time $t_{17}$, in further precharge period, the potential of the node N1 is changed to H level, and the output signal OUT remains at H level during the EVL period from time $t_{16}$ to $t_{17}$.

Thus, in the bus system in FIG. 19, by sampling the data in the EVL period before precharge by the precharge signal PC, the data is held within the precharge period, and therefore it functions also as dynamic latch, in addition to the sense amplifier.

In this way, by the constitution with a small number of transistors, the amplifying function and latch function of bus signal BUS can be shared. Hence, there is a merit that the layout area is saved.

While the invention has been shown and described in detail, the foregoing description is in all aspects illustrative and not restrictive. It is therefore understood that numerous modifications and variations can be devised without departing from the scope of the invention.

I claim:

1. A bus system comprising:

a bus, a precharge signal input line for inputting a precharge signal at a first level and a second level in a first period and a second period, respectively, said precharge signal repeating said first period and said second period alternately, a control signal input line for inputting a control signal changing in level in said second period, a data holding section connected to said bus and said control signal input line, for sending out a held data signal in response to the level change of said control signal to change the potential of said bus to said second level, an output line, first, second, and third power source lines at said first level, a first MOS transistor having its gate electrode, one semiconductor region, and other semiconductor region connected to said precharge signal input line, said first power source line, and said bus, respectively, a second MOS transistor having its gate electrode, one semiconductor region, and other semiconductor region connected to said second power source line, said output line, and said bus, respectively, and a third MOS transistor having its gate electrode, one semiconductor region, and other semiconductor region connected to said precharge signal input line, said third power source line, and said output line, respectively, wherein each of said first, second, and third MOS transistors has such characteristic that it is able to be logically ON when corresponding said gate electrode is at said first level.

2. A bus system of claim 1, wherein said data holding section comprises:
a register for holding said data signal,
a fourth MOS transistor having its gate electrode and one semiconductor region connected to an output of said register and said bus, respectively, and
a fifth MOS transistor having its gate electrode, one semiconductor region, and other semiconductor region connected to said control signal input line, other semiconductor region of said fourth MOS transistor, and a ground line.

3. A bus system of claim 1, further comprising:

an inverter connected to said precharge input signal line and the gate electrode of said third MOS transistor, wherein said first and second MOS transistors are MOS transistors of first channel type, and said third MOS transistor is a MOS transistor of second channel type.

4. A bus system of claim 1, wherein the relation of (threshold of said first MOS transistor)≦(threshold of said second MOS transistor) is established.

5. A bus system of claim 1, wherein said first MOS transistor and said second MOS transistor are disposed adjacently to each other in layout.

6. A bus system of claim 1, further comprising:
a bootstrap circuit having its one end and other end connected to said precharge signal input line and said bus, respectively, for enhancing the potential of said bus only in said second period.

7. A bus system of claim 6,
wherein said bootstrap circuit has a capacitance, said capacitance having its one end connected to said precharge signal line through an inverter, and its other end connected to said bus.

8. A bus system of claim 1,
wherein said second power source line comprises:
an inverter having its one end connected to said precharge signal input line,
a first load element having its one end connected to other end of said inverter, and
a voltage line connected between the other end of said first load element and the gate electrode of said second MOS transistor, further comprising:
a second load element connected between the other end of said first load element and a ground line.

9. A bus system of claim 1,
wherein said second power source line is a line for inputting a sense enable signal being at said first level only for a specific period.

10. A bus system of claim 1,
wherein said data holding section comprises:
a register for holding said data signal,
a p channel MOS transistor having its gate electrode and source region connected to said control signal input line and said bus, respectively, and
a fourth MOS transistor having its gate electrode one semiconductor region, and other semiconductor region connected to the output of said register, the drain region of said p channel MOS transistor, and a ground line respectively.

11. A bus system comprising:
a bus,
a precharge signal input line for inputting a precharge signal at a first level and a second level in a first period and a second period, respectively, said precharge signal repeating said first period and said second period alternately,
a control signal input line for inputting a control signal changing in level in said second period,
a data holding section connected to said bus and said control signal input line, for sending out a held data signal in response to the level change of said control signal to change thereby the potential of said bus toward said first level,
an output line,
a first MOS transistor having its gate electrode, one semiconductor region, and other semiconductor region connected to said precharge signal input line, said bus, and a ground line, respectively,
a second MOS transistor having its gate electrode, one semiconductor region, and other semiconductor region connected to said bus, said output line, and said ground line, respectively, and
a third MOS transistor having its gate electrode, one semiconductor region, and other semiconductor region connected to said precharge signal input line, a power source potential, and said output line, respectively,
wherein said first and second MOS transistors have channels of the same polarity, and each of said first and third MOS transistors has such characteristic that it is able to be ON upon input of said precharge signal at said first level.

12. A bus system of claim 11,
wherein said data holding section comprises:
a register for holding said data signal,
a fifth MOS transistor having its gate electrode and one semiconductor region connected to the output line of said register and said power source potential, respectively, and
a fourth MOS transistor having its gate electrode, one semiconductor region and other semiconductor region connected to said control signal input line, other semiconductor region of said fifth MOS transistor, and said bus, respectively.

13. A bus system of claim 11,
wherein said third MOS transistor has its gate electrode connected to said precharge signal input line through an inverter, and has a channel of different polarity from said first and second MOS transistors.

14. A bus system of claim 13, further comprising:
a sixth MOS transistor having its gate electrode, one semiconductor region, and other semiconductor region connected to the output line of said inverter, said other semiconductor region of said second MOS transistor, and said ground line, respectively, and has a channel of the same polarity as said first and second MOS transistors.

15. A bus system of claim 11, further comprising:
sense enable means connected between said other semiconductor region of said second MOS transistor and said ground line, for receiving plural sense enable signals,
wherein said sense enable means conducts between said other semiconductor region of said second MOS transistor and said ground line, as a function of the combination of logic levels of said plural sense enable signals.

16. A bus system of claim 15,
wherein said sense enable means is characterized by having a MOS tree having plural MOS transistors connected one another for receiving corresponding said sense enable signals at their gate electrodes.

17. A bus system of claim 11, further comprising:
latch means connected to said output line, for sampling the potential of said output line in said second period when said precharge signal is transferred from said second period to said first period, and for holding the obtained potential of said output line for said first period.

18. A bus system of claim 17,
wherein said latch means comprises:
a seventh MOS transistor having its gate electrode and one semiconductor region connected to said output line and said power source potential, respectively,
an eighth MOS transistor having its gate electrode and one semiconductor region connected to the output line of said inverter and other semiconductor region of said seventh MOS transistor, respectively, and
a ninth MOS transistor having its gate electrode, one semiconductor region, and other semiconductor region connected to said output line, other semiconductor region of said eighth MOS transistor, and said ground line, respectively,
wherein said seventh MOS transistor has a channel of different polarity from said first and second MOS transistors, and said eighth and ninth MOS transistors have channels of the same polarity as said first and second MOS transistors.

19. A bus sense amplifier for receiving a precharge signal inputline for inputting a precharge signal at a first level and a second level in a first period and a second period respectively, said precharge signal repeating said first period and said second period alternately, and said bus sense amplifier for receiving a bus, said bus having a potential, during said second period, of said second level in response to an output to said bus from a register, said register for holding a data signal, comprising:

- a first MOS transistor of first polarity having its gate electrode and one semiconductor region connected to said precharge signal input line and said bus, respectively, of which conduction is controlled by said precharge signal at said first level,
- a second MOS transistor having said first polarity having its one semiconductor region connected to said bus, with a potential of an ON enable level being applied to its gate electrode,
- an inverter connected to said precharge signal input line, and
- a third MOS transistor of second polarity different from said first polarity, having its gate electrode, one semiconductor region, and other semiconductor region connected to the output line of said inverter, power source potential, and other semiconductor region of said second MOS transistor, respectively.

20. A bus sense amplifier of claim 19, wherein the potential of the gate electrode of said second MOS transistor is lowered from the potential of the gate electrode of said first MOS transistor.

21. A bus sense amplifier of claim 19, wherein a bias obtained by resistance division of the voltage of said first level is applied to the gate electrode of said second MOS transistor.

22. A bus sense amplifier of claim 19, wherein a bias obtained by resistance division through a second inverter connected to said precharge signal input line is applied to the gate electrode of said second MOS transistor.

23. A bus system, comprising:

a bus;

precharge signal input line for inputting a precharge signal at a first level and a second level in a first period and a second period, respectively, said precharge signal repeating said first period and said second period alternately;

a control signal input line for inputting a control signal changing in level in said second period;

a data holding section connected to said bus and said control signal input line, for sending out a held data signal in response to the level change of said control signal to change the potential of said bus to said second level; and a bus sensing means, said bus sensing means connected to said precharge signal input line and said bus, and having an output line, said bus sensing means for initializing said output line to the first level defining an initialized state in response to said first level of said precharge signal, and for changing the first level on said output line to said second level when said potential of said bus is at said second level and maintaining said initialized state of said output line when said potential of said bus is not at said second level.

* * * * *